(12) United States Patent
Kurokawa

(10) Patent No.: US 9,871,526 B2
(45) Date of Patent: Jan. 16, 2018

(54) SEMICONDUCTOR DEVICE AND ELECTRONIC DEVICE INCLUDING ANALOG/DIGITAL CONVERTER

(75) Inventor: Yoshiyuki Kurokawa, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 714 days.

(21) Appl. No.: 12/984,061

(22) Filed: Jan. 4, 2011

(65) Prior Publication Data
US 2011/0176652 A1    Jul. 21, 2011

(30) Foreign Application Priority Data
Jan. 15, 2010    (JP) .................................. 2010-007249

(51) Int. Cl.
*G01J 1/42*    (2006.01)
*H03K 23/54*    (2006.01)
(Continued)

(52) U.S. Cl.
CPC ........... *H03K 23/548* (2013.01); *H04N 5/357* (2013.01); *H04N 5/374* (2013.01); *H04N 5/378* (2013.01);
(Continued)

(58) Field of Classification Search
CPC .... H03M 1/1009; H03M 1/123; H03M 1/124; H03M 1/68; H03K 21/00; H03K 23/00;
(Continued)

(56) References Cited

U.S. PATENT DOCUMENTS 3,678,500 A  *  7/1972  Bauer .......................... 341/157
4,285,584 A  *  8/1981  Canter .......................... 396/234
(Continued)

FOREIGN PATENT DOCUMENTS

CN    001490879 A    4/2004
EP    0665685 A    8/1995
(Continued)

OTHER PUBLICATIONS

International Search Report (Application No. PCT/JP2010/073256) dated Feb. 8, 2011.
(Continued)

*Primary Examiner* — Georgia Y Epps
*Assistant Examiner* — Kevin Wyatt
(74) *Attorney, Agent, or Firm* — Nixon Peabody LLP; Jeffrey L. Costellia

(57) ABSTRACT

Noise in a semiconductor device including a photo sensor is reduced. The semiconductor device includes an analog/digital converter and a photo sensor including a photodiode. The analog/digital converter includes an oscillation circuit and a counter circuit. A first signal output from the photo sensor is input to the oscillation circuit. The oscillation circuit has a function of outputting a second signal obtained by a change in oscillation frequency of the first signal. The counter circuit has a count function by which addition or subtraction is performed by a control signal with the second signal used as a clock signal. The counter circuit performs subtraction during the reset operation of the photo sensor. The counter circuit performs addition during the selection operation of the photo sensor. Thus, the output value of the analog/digital converter can be corrected.

31 Claims, 16 Drawing Sheets

(51) Int. Cl.
*H04N 5/357* (2011.01)
*H04N 5/374* (2011.01)
*H04N 5/378* (2011.01)
*H03M 1/12* (2006.01)
*H03M 1/60* (2006.01)
*H01L 27/146* (2006.01)

(52) U.S. Cl.
CPC .. *H01L 27/14609* (2013.01); *H01L 27/14665* (2013.01); *H03M 1/123* (2013.01); *H03M 1/60* (2013.01)

(58) Field of Classification Search
CPC ...... H03K 23/548; H03K 23/56; H04N 5/357; H04N 5/374; H04N 5/378
USPC ....... 345/175, 207; 250/551, 214 DC, 208.1, 250/214 AL, 207, 208.3; 341/155–172
See application file for complete search history.

(56) References Cited

U.S. PATENT DOCUMENTS

| | | | |
|---|---|---|---|
| 4,972,252 A * | 11/1990 | Maekawa | H01L 27/1443 257/448 |
| 5,168,528 A * | 12/1992 | Field, Jr. | G01S 3/7865 250/332 |
| 5,172,117 A * | 12/1992 | Mills et al. | 341/157 |
| 5,808,677 A | 9/1998 | Yonemoto | |
| 5,877,715 A | 3/1999 | Gowda et al. | |
| 5,982,318 A * | 11/1999 | Yiannoulos | 341/155 |
| 6,037,979 A | 3/2000 | Yonemoto | |
| 6,160,282 A * | 12/2000 | Merrill | 257/292 |
| 6,366,321 B1 | 4/2002 | Yonemoto | |
| 6,384,398 B1 * | 5/2002 | Kalnitsky et al. | 250/208.1 |
| 6,542,105 B2 * | 4/2003 | Sakuragi | 341/164 |
| 6,556,155 B1 | 4/2003 | Wiles | |
| 6,618,115 B1 | 9/2003 | Hiroki | |
| 6,747,638 B2 | 6/2004 | Yamazaki et al. | |
| 6,831,264 B2 | 12/2004 | Cazaux | |
| 6,839,084 B1 | 1/2005 | Hiyama et al. | |
| 6,930,299 B2 | 8/2005 | Ohkawa | |
| 6,936,904 B2 | 8/2005 | Toyoda et al. | |
| 6,995,753 B2 * | 2/2006 | Yamazaki et al. | 345/204 |
| 7,102,673 B2 | 9/2006 | Kimura | |
| 7,453,065 B2 | 11/2008 | Saito et al. | |
| 7,525,523 B2 | 4/2009 | Yamazaki et al. | |
| 7,532,145 B2 | 5/2009 | Davidovici | |
| 7,535,010 B2 | 5/2009 | Saito et al. | |
| 7,541,595 B2 | 6/2009 | Yagi et al. | |
| 7,605,355 B2 | 10/2009 | Davidovici | |
| 7,663,116 B2 | 2/2010 | Saito et al. | |
| 7,663,165 B2 | 2/2010 | Mouli | |
| 7,795,676 B2 | 9/2010 | Mabuchi | |
| 7,800,594 B2 | 9/2010 | Nakamura et al. | |
| 7,812,877 B2 | 10/2010 | Suzuki et al. | |
| 7,847,233 B2 | 12/2010 | Fukushima | |
| 8,030,720 B2 | 10/2011 | Mabuchi | |
| 8,035,076 B2 | 10/2011 | Fukushima | |
| 8,039,917 B2 | 10/2011 | Miura | |
| 8,084,743 B2 | 12/2011 | Saito et al. | |
| 8,188,522 B2 | 5/2012 | Mabuchi | |
| 8,198,694 B2 | 6/2012 | Mabuchi | |
| 8,198,695 B2 | 6/2012 | Mabuchi | |
| 8,227,887 B2 | 7/2012 | Brown et al. | |
| 8,440,977 B2 | 5/2013 | Ishii et al. | |
| 8,546,738 B2 | 10/2013 | Fukushima | |
| 8,597,972 B2 | 12/2013 | Mabuchi | |
| 2001/0048140 A1 | 12/2001 | Toyoda et al. | |
| 2002/0109620 A1 | 8/2002 | Sakuragi | |
| 2002/0196170 A1 * | 12/2002 | McIlrath | 341/155 |
| 2004/0061193 A1 | 4/2004 | Toyoda et al. | |
| 2004/0169127 A1 * | 9/2004 | Ohkawa | 250/214.1 |
| 2006/0077169 A1 | 4/2006 | Fujikawa | |
| 2006/0286708 A1 * | 12/2006 | Rhodes | 438/57 |
| 2007/0064128 A1 | 3/2007 | Davidovici | |
| 2007/0064146 A1 | 3/2007 | Davidovici | |
| 2007/0085529 A1 | 4/2007 | Davidovici | |
| 2007/0093007 A1 * | 4/2007 | Deane | H01L 27/1214 438/154 |
| 2008/0158137 A1 | 7/2008 | Yoshida | |
| 2008/0160660 A1 * | 7/2008 | Shim | 438/59 |
| 2008/0245968 A1 * | 10/2008 | Tredwell | G01T 1/2018 250/370.09 |
| 2009/0050891 A1 * | 2/2009 | Katoh | H01L 31/105 257/66 |
| 2009/0289174 A1 | 11/2009 | Koyama et al. | |
| 2009/0295769 A1 | 12/2009 | Yamazaki et al. | |
| 2009/0324244 A1 | 12/2009 | Koyama et al. | |
| 2010/0035661 A1 | 2/2010 | Amano et al. | |
| 2010/0053395 A1 * | 3/2010 | Motonaga | 348/300 |
| 2010/0328269 A1 | 12/2010 | Kurokawa | |
| 2012/0153173 A1 * | 6/2012 | Chang | H01L 27/14603 250/370.08 |
| 2014/0038342 A1 | 2/2014 | Mabuchi | |

FOREIGN PATENT DOCUMENTS

| | | |
|---|---|---|
| EP | 1394858 A | 3/2004 |
| EP | 2154731 A | 2/2010 |
| JP | 02-143573 A | 6/1990 |
| JP | 07-255013 A | 10/1995 |
| JP | 2000-077642 A | 3/2000 |
| JP | 2001-292276 | 10/2001 |
| JP | 2002-369085 A | 12/2002 |
| JP | 2005-079438 A | 3/2005 |
| JP | 2006-165530 A | 6/2006 |
| JP | 2006-173351 A | 6/2006 |
| JP | 2006-270293 A | 10/2006 |
| JP | 2007-027691 A | 2/2007 |
| JP | 2007-251074 A | 9/2007 |
| JP | 2008-235477 A | 10/2008 |
| JP | 2009-133837 A | 6/2009 |
| JP | 2009-535819 | 10/2009 |
| JP | 2009-284388 | 12/2009 |
| WO | WO-2008/027392 | 3/2008 |
| WO | WO-2008/156023 | 12/2008 |
| WO | WO-2009/060968 | 5/2009 |

OTHER PUBLICATIONS

Written Opinion (Application No. PCT/JP2010/073256) dated Feb. 8, 2011.
Chinese Office Action (Application No. 201080061288.3) dated Dec. 17, 2014.
Taiwanese Office Action (Application No. 100100328) dated Sep. 23, 2015.

* cited by examiner

SEMICONDUCTOR DEVICE AND ELECTRONIC DEVICE INCLUDING ANALOG/DIGITAL CONVERTER

TECHNICAL FIELD

The invention disclosed in this specification relates to a semiconductor device and a driving method thereof. In particular, the invention disclosed in this specification relates to a display device including a pixel portion having a photo sensor and a driving method of the display device. Further, the invention disclosed in this specification relates to an electronic device including the semiconductor device or the display device.

BACKGROUND ART

In recent years, semiconductor devices including photo sensors (also referred to as optical sensors) have attracted attention. A photo sensor can detect the physical quantity such as the presence, size (e.g., width or length), illuminance, color, or reflection pattern of an object by light and convert it into an electric signal. As example of semiconductor device including photo sensors, there are a contact area sensor and a display device including the contact area sensor (for example, see Reference 1).

REFERENCE

[Reference 1] Japanese Published Patent Application No. 2001-292276

DISCLOSURE OF INVENTION

In order to accurately output an electric signal obtained from a photo sensor included in a semiconductor device, it is necessary to reduce noise. The noise results from, for example, variation in characteristics of the photo sensor, variation in characteristics of an analog/digital converter (hereinafter referred to as an A/D converter) used for conversion of an electric signal (an analog signal) obtained by detection of light by the photo sensor into a digital signal, or the like.

One embodiment of the present invention is made in view of the foregoing problem. An object is to reduce noise in a semiconductor device including a photo sensor. An object is to reduce noise in a display device including a photo sensor and provide a display device capable of taking highly accurate images.

Note that it is acceptable as long as one embodiment of the present invention can achieve at least one of the objects.

In one embodiment of the present invention, using a count value that is calculated in a counter circuit from an electric signal generated by a photo sensor in a first state, a count value that is calculated in the counter circuit from an electric signal generated by a photo sensor in a second state is corrected. With such correction, noise caused by variation in characteristics of the photo sensor, variation in characteristics of an A/D converter, or the like can be reduced.

One embodiment of the present invention is a semiconductor device which includes an A/D converter and a photo sensor including a photodiode. The A/D converter includes an oscillation circuit and a counter circuit. A first signal output from the photo sensor is input to the oscillation circuit. The oscillation circuit has a function of outputting a second signal obtained by a change in oscillation frequency of the first signal. The counter circuit has a count function by which addition or subtraction is performed by a control signal with the second signal used as a clock signal. Using a count value that is calculated in the counter circuit from an electric signal generated by the photo sensor when the photo sensor is in a first state, a count value that is calculated in the counter circuit from an electric signal generated by the photo sensor when the photo sensor is in a second state is corrected. The counter circuit performs subtraction of the count value when the photo sensor is in the first state. The counter circuit performs addition of the count value when the photo sensor is in the second state.

One embodiment of the present invention is a semiconductor device which includes an A/D converter and a photo sensor including a photodiode, a first transistor, and a second transistor. The A/D converter includes an oscillation circuit and a counter circuit. One electrode of the photodiode is electrically connected to a first wiring. The other electrode of the photodiode is electrically connected to a gate of the first transistor. One of a source and a drain of the first transistor is electrically connected to a second wiring. The other of the source and the drain of the first transistor is electrically connected to one of a source and a drain of the second transistor. The other of the source and the drain of the second transistor is electrically connected to a third wiring which outputs a first signal. A gate of the second transistor is electrically connected to a fourth wiring. The first signal is input to the oscillation circuit. The oscillation circuit has a function of outputting a second signal obtained by a change in oscillation frequency of the first signal. The counter circuit has a count function by which addition or subtraction is performed by a control signal with the second signal used as a clock signal.

One embodiment of the present invention is a semiconductor device which includes an A/D converter and a pixel portion including a photo sensor having a photodiode, a first transistor, and a second transistor. The A/D converter includes an oscillation circuit and a counter circuit. One electrode of the photodiode is electrically connected to a first wiring. The other electrode of the photodiode is electrically connected to a gate of the first transistor. One of a source and a drain of the first transistor is electrically connected to a second wiring. The other of the source and the drain of the first transistor is electrically connected to one of a source and a drain of the second transistor. The other of the source and the drain of the second transistor is electrically connected to a third wiring which outputs a first signal. A gate of the second transistor is electrically connected to a fourth wiring. The first signal is input to the oscillation circuit. The oscillation circuit has a function of outputting a second signal obtained by a change in oscillation frequency of the first signal. The counter circuit has a count function by which addition or subtraction is performed by a control signal with the second signal used as a clock signal.

In one embodiment of the present invention, a third transistor is provided between the other electrode of the photodiode and the gate of the first transistor. One of a source and a drain of the third transistor is electrically connected to the other electrode of the photodiode. The other of the source and the drain of the third transistor is electrically connected to the gate of the first transistor. A gate of the third transistor is electrically connected to a fifth wiring.

In one embodiment of the present invention, the first transistor and the second transistor each include a crystalline silicon layer, and the third transistor includes an oxide semiconductor layer.

In one embodiment of the present invention, the oxide semiconductor layer has a carrier concentration lower than $1 \times 10^{14}/cm^3$.

In one embodiment of the present invention, the photodiode is a pin diode including silicon or a pn diode including silicon.

One embodiment of the present invention is an electronic device including the semiconductor device.

Note that it is difficult to distinguish a source and a drain of a transistor from each other because of the structure of the transistor. Further, the levels of potentials might be changed depending on the operation of a circuit. Therefore, in this specification, a source and a drain are not particularly specified and are referred to as a first electrode (or a first terminal) and a second electrode (or a second terminal) in some cases. For example, in the case where the first electrode corresponds to a source, the second electrode corresponds to a drain, whereas in the case where the first electrode corresponds to a drain, the second electrode corresponds to a source.

Note that in this specification, when it is described that "A and B are electrically connected", the case where A and B are connected with another element or another circuit provided therebetween, the case where A and B are functionally connected (i.e., the case where A and B are functionally connected with another circuit provided therebetween), and the case where A and B are directly connected (i.e., the case where A and B are connected without provision of another element or another circuit therebetween) are included. Note that each of A and B is an object to be connected (e.g., a device, an element, a circuit, a wiring, an electrode, a terminal, a conductive film, or a layer).

Further, in this specification, the expression "a potential (or a signal) is 'H'" means that the potential is higher than a certain potential (a reference potential). In contrast, the expression "a potential (or a signal) is 'L'" means that the potential is lower than a certain potential (a reference potential).

Furthermore, in this specification, ordinal numbers such as "first", "second", and "third" are used in order to avoid confusion among components and do not limit the number. For example, a transistor which is referred to as a "first transistor" in this specification can be read as a "second transistor" as long as it is not confused with another component.

In one embodiment of the present invention, noise in a semiconductor device including a photo sensor can be reduced. Further, noise in a display device including a photo sensor can be reduced and highly accurate images can be taken.

BEST MODE FOR CARRYING OUT THE INVENTION

Figure 1:
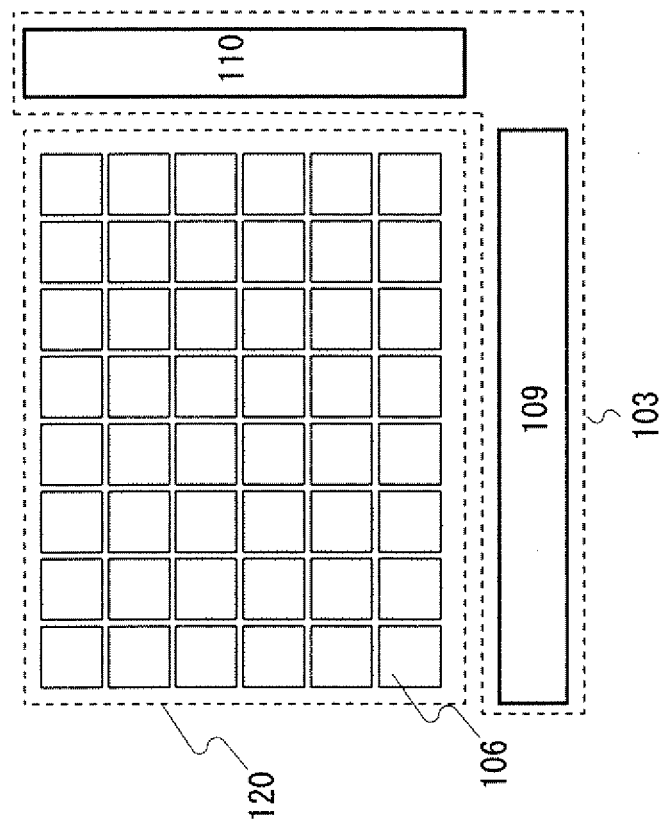
FIG. 1 illustrates an example of a semiconductor device including a photo sensor.

Embodiments of the present invention will be described in detail with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the description of the embodiments. Note that in the embodiments of the present invention to be described below, reference numerals denoting the same components are used in common in different drawings.

Note that each of the embodiments described below can be combined with any of the other embodiments described in this specification as appropriate unless otherwise specified.

Embodiment 1

In this embodiment, examples of the structure of a semiconductor device which is one embodiment of the present invention are described with reference to FIG. 1, FIG. 2, FIG. 3, FIG. 4, FIG. 5, FIG. 6, FIG. 7, and FIG. 8.

As illustrated in FIG. 1, a semiconductor device in this embodiment includes a photo sensor portion 120 and a photo sensor control circuit 103. The photo sensor portion 120 illustrated in FIG. 1 is an area sensor where photo sensors 106 are arranged in matrix; however, the present invention is not limited to the area sensor. A line sensor may be used. Note that the area sensor is preferable because it is not necessary to scan an object to be detected while the area sensor moves physically like the line sensor.

The photo sensor control circuit 103 includes a photo sensor readout circuit 109 and a photo sensor driver circuit 110. In addition, the photo sensor control circuit 103 has a function of controlling the photo sensors 106.

The photo sensor driver circuit 110 has a function of selecting the photo sensors 106 arranged in a particular row. Further, the photo sensor readout circuit 109 has a function of reading output signals of the photo sensors 106 in the selected row.

The photo sensor 106 includes an element which has a function of generating an electric signal by receiving light (e.g., a photodiode). In addition, the photo sensor 106 receives reflected light or transmitted light when an object to be detected is irradiated with outside light or light from a backlight. Here, in the case where color filters of red (R), green (G), and blue (B) are provided in the photo sensors 106, reflected light or transmitted light when the object to be detected is irradiated with outside light or light from the backlight can be detected individually as a red (R) color component, a green (G) color component, and a blue (B) color component.

Next, an example of the circuit structure of the photo sensor 106 is described with reference to FIG. 2. The photo sensor 106 illustrated in FIG. 2 includes a photodiode 204, a transistor 205, and a transistor 206. Note that the circuit structure of the photo sensor 106 which can be used in the present invention is not limited to the circuit structure illustrated in FIG. 2.

One electrode of the photodiode 204 is electrically connected to a wiring (also referred to as a photodiode reset signal line) 208, and the other electrode of the photodiode 204 is electrically connected to a gate of the transistor 205 through a wiring 213. Note that in this embodiment, the one electrode of the photodiode 204 corresponds to an anode, and the other electrode of the photodiode 204 corresponds to a cathode. However, the present invention is not limited to this structure. In other words, in the present invention, the one electrode of the photodiode 204 can correspond to a cathode, and the other electrode of the photodiode 204 can correspond to an anode. One of a source and a drain of the transistor 205 is electrically connected to a wiring (also referred to as a photo sensor reference signal line) 212, and the other of the source and the drain of the transistor 205 is electrically connected to one of a source and a drain of the transistor 206. Here, the wiring 212 is supplied with a reference potential and can be referred to as a reference power supply line. In addition, a gate of the transistor 206 is electrically connected a wiring (also referred to as a gate signal line) 209, and the other of the source and the drain of the transistor 206 is electrically connected to a wiring 211. Further, the wiring 209 is electrically connected to the photo sensor driver circuit 110. On/off of the transistor 206 is controlled by a signal output from the photo sensor driver circuit 110. Furthermore, the wiring 211 is electrically connected the photo sensor readout circuit 109. The wiring 211 has a function of outputting an electric signal obtained from the photo sensor 106 to the photo sensor readout circuit 109; thus, the wiring 211 can be referred to as a photo sensor output signal line.

The photodiode 204 can have a variety of structures. For example, the photodiode 204 can be a pin diode including silicon or a pn diode including silicon. In particular, in order to increase the rate of an electric signal generated from incident light (the rate is referred to as quantum efficiency), single crystal silicon, which has less crystal defects, is preferably used as silicon.

The transistor 205 has a function of generating an output signal of the photo sensor 106 according to the amount of electrical charges supplied from the photodiode 204. Further, the transistor 206 functions as a switch which selects whether an output signal generated by the transistor 205 is supplied to the photo sensor output signal line 211.

The transistors 205 and 206 each have a semiconductor layer for a channel formation region. The material of the semiconductor layer is not particularly limited to a certain material, and silicon, an oxide semiconductor, or the like can be used. The material of the semiconductor layer may be amorphous or crystalline. For example, when the transistors 205 and 206 each have a crystalline semiconductor layer (preferably a crystalline silicon layer such as a single crystal silicon layer) for the channel formation region, a signal can be output quickly from the photo sensor 106 to the photo sensor output signal line 211. In periods except the readout period of the photo sensor, it is preferable to prevent conduction between the wirings 211 and 212 through the transistors 205 and 206 as much as possible. Therefore, at least one of the transistors 205 and 206 preferably has significantly low off state current. From this perspective, at least one of the transistors 205 and 206 preferably has an oxide semiconductor layer for the channel formation region because a transistor including an oxide semiconductor layer has significantly low off state current.

Figure 3:
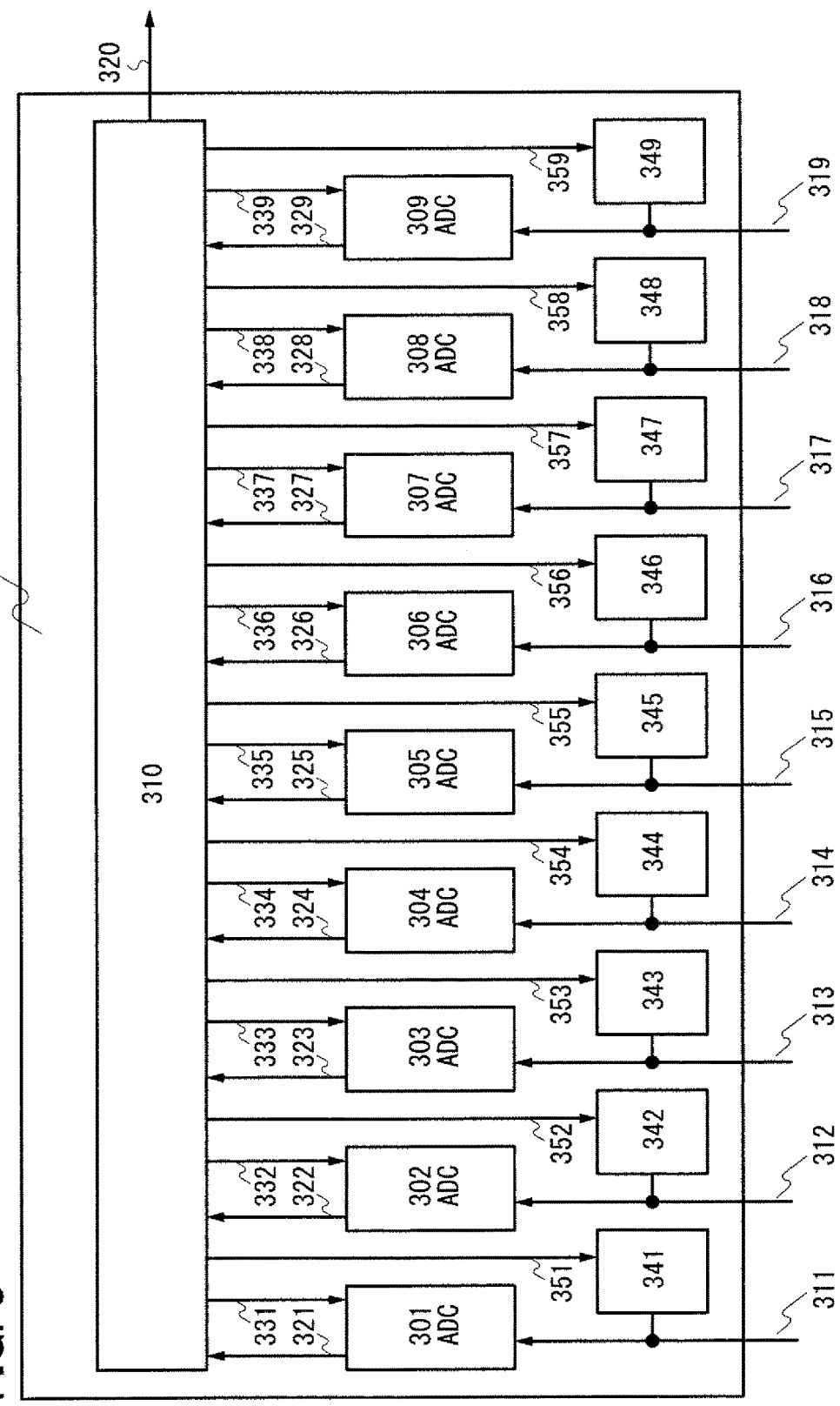
FIG. 3 illustrates an example of a photo sensor readout circuit.
Figure 4:
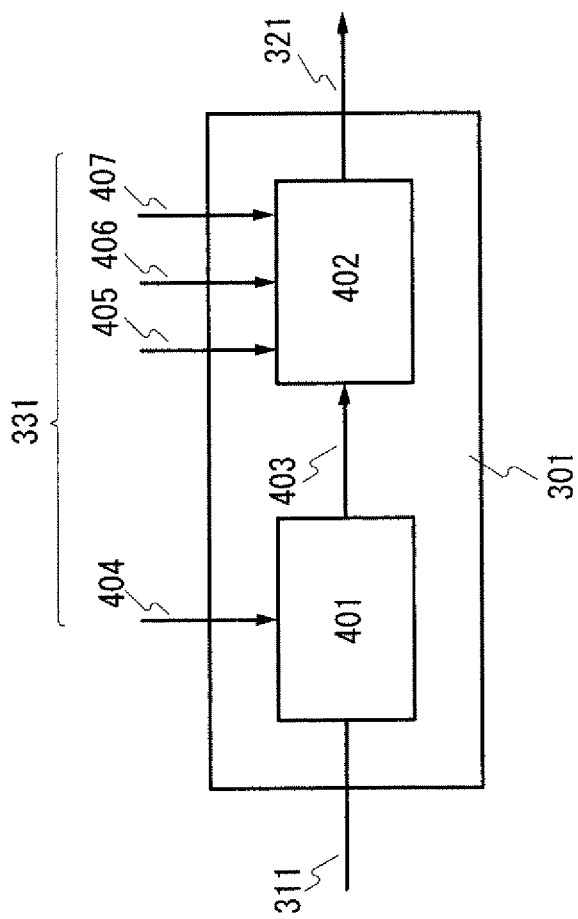
FIG. 4 illustrates an example of the photo sensor readout circuit.

As illustrated in FIG. 3, the photo sensor readout circuit 109 includes first to ninth A/D converters (hereinafter referred to as ADC) 301 to 309, an ADC control circuit 310, and first to ninth auxiliary readout circuits 341 to 349. First to ninth photo sensor signal lines 311 to 319 correspond to the wirings 211 of the photo sensors 106 for one column. Note that FIG. 3 illustrates the case where the number of A/D converters is nine and the number of auxiliary readout circuits is nine; however, the present invention is not limited to this structure. For example, the number of A/D converters or the number of auxiliary readout circuits can be the same as the number of the photo sensors 106 for one column.

The ADC control circuit 310 generates an output signal of the photo sensor readout circuit 109 from the potentials of first to ninth ADC output signal lines 321 to 329. Specifically, the ADC control circuit 310 selects one of the first to ninth ADC output signal lines 321 to 329 and outputs the potential of the selected signal line to the output signal line 320. In addition, the ADC control circuit 310 generates potentials output to first to ninth ADC control signal lines 331 to 339 and potentials output to first to ninth auxiliary readout circuit control signal lines 351 to 359.

Next, examples of the structures of the first to ninth ADCs 301 to 309 are described. The structure of the first ADC 301 is described below with reference to FIG. 4 as a typical example. Note that the structures of the second to ninth ADCs 302 to 309 can be similar to the structure of the first ADC 301.

The first ADC 301 includes an oscillation circuit 401 for controlling voltage (hereinafter such a circuit is referred to as VCO) and a counter circuit 402.

In the VCO 401, the cycle of the toggle of an output signal (the cycle of a change from "H" to "L" or "L" to "H") varies depending on the input potential of the first photo sensor signal line 311 (i.e., a signal output from the photo sensor 106). The output signal of the VCO 401 is output to an output signal line 403. Here, a period from when the output signal is changed from "L" to "H" till when the output signal is changed from "L" to "H" again is the oscillation cycle of the VCO 401. In addition, the oscillation frequency of the VCO 401 is the reciprocal of the oscillation cycle of the VCO 401. Further, regardless of the potential of the first photo sensor signal line 311, the output signal of the VCO 401 can have a constant value by a stop signal supplied from a stop signal line 404. For example, when the stop signal is "H", the output signal can be "L".

The counter circuit 402 is operated by the input of the output signal of the VCO 401 as a clock signal. The count value in the counter circuit 402 is increased or decreased depending on the oscillation frequency of the VCO 401. The increase or decrease in the count value can be selected by a count-value increase and decrease control signal supplied from a count-value increase and decrease control signal line 407. For example, the increase or decrease in the count value can be set in such a manner that the count value is increased when the count-value increase and decrease control signal is "H" and the count value is decreased when the count-value increase and decrease control signal is "L".

The count value in the counter circuit 402 can be set to an initial value by a reset signal supplied from a reset signal line 405. For example, when the reset signal is "H", the initial value can be "0". In addition, the count value in the counter circuit 402 is output to the first ADC output signal line 321 as a digital value by a set signal supplied from a set signal line 406. For example, the count value in the counter circuit 402 at the time of when the set signal is changed from "L" to "H" can be output to the first ADC output signal line 321 as a digital value.

Note that the stop signal line 404, the reset signal line 405, the set signal line 406, and the count-value increase and decrease control signal line 407 correspond to the first ADC control signal line 331.

Here, the oscillation frequency of the VCO 401 is high (or low) when the potential of the first photo sensor signal line 311 is high (or low). The absolute value of the count value within a certain period is large (or small) because the counter circuit 402 is operated by a clock signal with high (or low) frequency. Thus, a digital value output to the first ADC output signal line 321 is large (or small). In other words, the first ADC 301 has a function of outputting a digital value corresponding to the potential of the first photo sensor signal line 311 that is an analog value.

Figure 5:
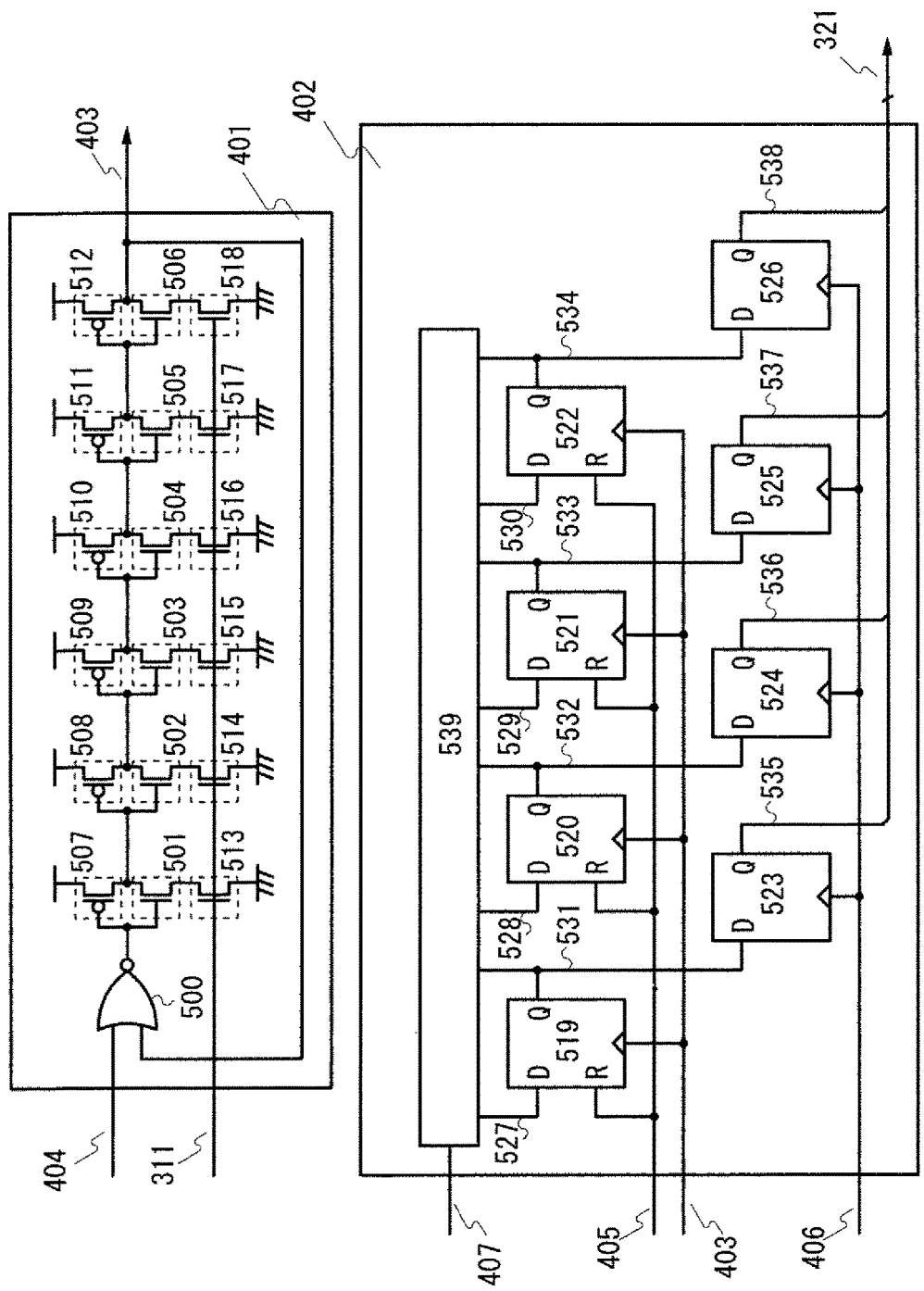
FIG. 5 illustrates an example of the photo sensor readout circuit.

Next, examples of the VCO 401 and the counter circuit 402 are described with reference to FIG. 5. The VCO 401 in FIG. 5 includes a NOR circuit 500, first to sixth n-channel transistors 501 to 506, first to sixth p-channel transistors 507 to 512, and seventh to twelfth n-channel transistors 513 to 518. Here, the VCO 401 in FIG. 5 is operated in such a manner that the oscillation frequency becomes higher in proportion to the increase in the potential of the first photo sensor signal line 311. Further, when the potential of the stop signal line 404 is "H", the output signal can be "L" regardless of the potential of the first photo sensor signal line 311.

A first voltage control circuit includes the first n-channel transistor 501, the first p-channel transistor 507, and the seventh n-channel transistor 513. By control of the gate voltage of the seventh n-channel transistor 513 by the potential of the first photo sensor signal line 311, the drive state of the seventh n-channel transistor 513 is changed, so that the delay time in the first voltage control circuit is changed. Note that second to sixth voltage control circuits have structures which are similar to that of the first voltage control circuit, and include the second to sixth n-channel transistors 502 to 506, the second to sixth p-channel transistors 508 to 512, and the eighth to twelfth n-channel transistors 514 to 518.

Note that although the VCO 401 includes seven stages: the NOR circuit 500 and the first to sixth voltage control circuits in FIG. 5, the present invention is not limited to this structure. The VCO 401 can have a different structure as long as the number of stages is odd.

In addition, when the oscillation frequency of the VCO becomes higher as the potential of the first photo sensor signal line 311 becomes lower, the structure of the voltage control circuit in FIG. 5 may be changed. Specifically, a voltage control circuit which includes a first p-channel transistor, a second p-channel transistor, and an n-channel transistor may be used. One of a source and a drain of the first p-channel transistor is electrically connected to a high power supply line. The other of the source and the drain of the first p-channel transistor is electrically connected to one of a source and a drain of the second p-channel transistor. The other of the source and the drain of the second p-channel transistor is electrically connected to one of a source and a drain of the n-channel transistor. The other of the source and the drain of the n-channel transistor is electrically connected to a low power supply line (e.g., a wiring to which a ground potential is applied). The potential of the first photo sensor signal line 311 may be input to a gate of the first p-channel transistor. An output signal of the NOR circuit 500 may be input to a gate of the second p-channel transistor and a gate of the n-channel transistor. A potential between the other of the source and the drain of the second p-channel transistor and the one of the source and the drain of the n-channel transistor may be used as an output signal of the voltage control circuit.

Further, when the NOR circuit is replaced with a NAND circuit, a VCO can have a structure in which an output signal is "H" when the stop signal line 404 is "L" regardless of the potential of the first photo sensor signal line 311.

The counter circuit 402 in FIG. 5 includes first to fourth reset flip-flops 519 to 522, first to fourth flip-flops 523 to 526, and an addition/subtraction circuit 539. In FIG. 5, the first to fourth reset flip-flops 519 to 522 and the addition/subtraction circuit 539 constitute a 4-bit addition/subtraction counter. Values in zeroth to third bits of the count value in the addition/subtraction counter are output to signal lines 531 to 534. The count value in the addition/subtraction counter is set to an initial value "0000" when the reset signal line 405 is "H". In addition, the addition/subtraction counter is operated by the input of the output signal of the VCO 401 through the output signal line 403 as a clock signal. In the case where the potential of the count-value increase and decrease control signal line 407 is "H" (or "L"), a value obtained by addition of "1" to (or obtained by subtraction of "1" from) the count value in the addition/subtraction counter that is output to the signal lines 531 to 534 is output to signal lines 527 to 530. When the clock signal is changed from "L" to "H", the value is changed to a value that is output to the signal lines 531 to 534.

When the level of the potential of the set signal line 406 is changed from "L" to "H", the count value in the addition/subtraction counter is stored in the first to fourth flip-flops 523 to 526 and is output to zeroth to third bit signal lines 535 to 538 as a digital value. Note that the zeroth to third bit signal lines 535 to 538 constitute the first ADC output signal line 321.

Note that although the counter circuit 402 includes the 4-bit addition/subtraction counter and the 4-bit flip-flop in FIG. 5, the present invention is not limited to this structure. In other words, in the present invention, the counter circuit can be constituted with a given number of bits (n bits (n: a natural number)). In addition, although the flip-flop which is operated with a change in the level of the potential of the set signal line 406 from "L" to "H", i.e., with the rising edge of a set signal is used in order to calculate the count value in the addition/subtraction counter, a flip-flop which is operated with a change in the level of the potential of the set signal line 406 from "H" to "L", i.e., with the falling edge of a set signal may be used. Alternatively, a level sensitive latch which is operated when the set signal is "H" or "L" may be used.

Next, examples of the structures of the first to ninth auxiliary readout circuits 341 to 349 are described. The structure of the first auxiliary readout circuit 341 is described below with reference to FIG. 6 as a typical example. The structures of the second to ninth auxiliary readout circuits 342 to 349 can be similar to the structure of the first auxiliary readout circuit 341.

Figure 6:
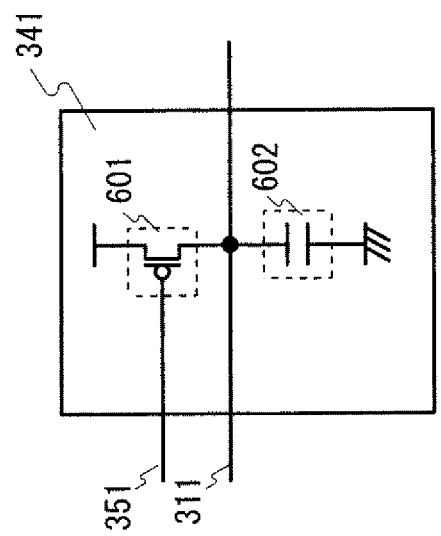
FIG. 6 illustrates an example of the photo sensor readout circuit.

The first auxiliary readout circuit 341 includes a p-channel transistor 601 and a storage capacitor 602. In the first auxiliary readout circuit 341, the potential of the photo sensor signal line is set to a reference potential before the operation of a photo sensor in a photo sensor portion. In FIG. 6, when the potential of the first auxiliary readout circuit control signal line 351 is "L", the first photo sensor signal line 311 can be set to have a reference potential (a high potential). Note that the storage capacitor 602 is not necessarily provided in the case where the parasitic capacitance of the first photo sensor signal line 311 is high. Note that the reference potential can be a low potential. In that case, when an n-channel transistor is used instead of the p-channel transistor 601 and the potential of the first auxiliary readout circuit control signal line 351 is "H", the first photo sensor signal line 311 can be set to have a reference potential (a low potential).

Next, a method for driving the semiconductor device in this embodiment is described. In the method for driving the semiconductor device in this embodiment, using a count value that is calculated in the counter circuit from an electric signal generated by the photo sensor in a first state, a count value that is calculated in the counter circuit from an electric signal generated by the photo sensor in a second state is corrected. Here, the addition/subtraction counter is operated as a subtraction counter when the photo sensor is in the first state so that A/D conversion is performed, and the addition/subtraction counter is operated as an addition counter when the photo sensor is in the second state so that A/D conversion is performed. Thus, the output value of an A/D converter can be corrected.

Figure 8:
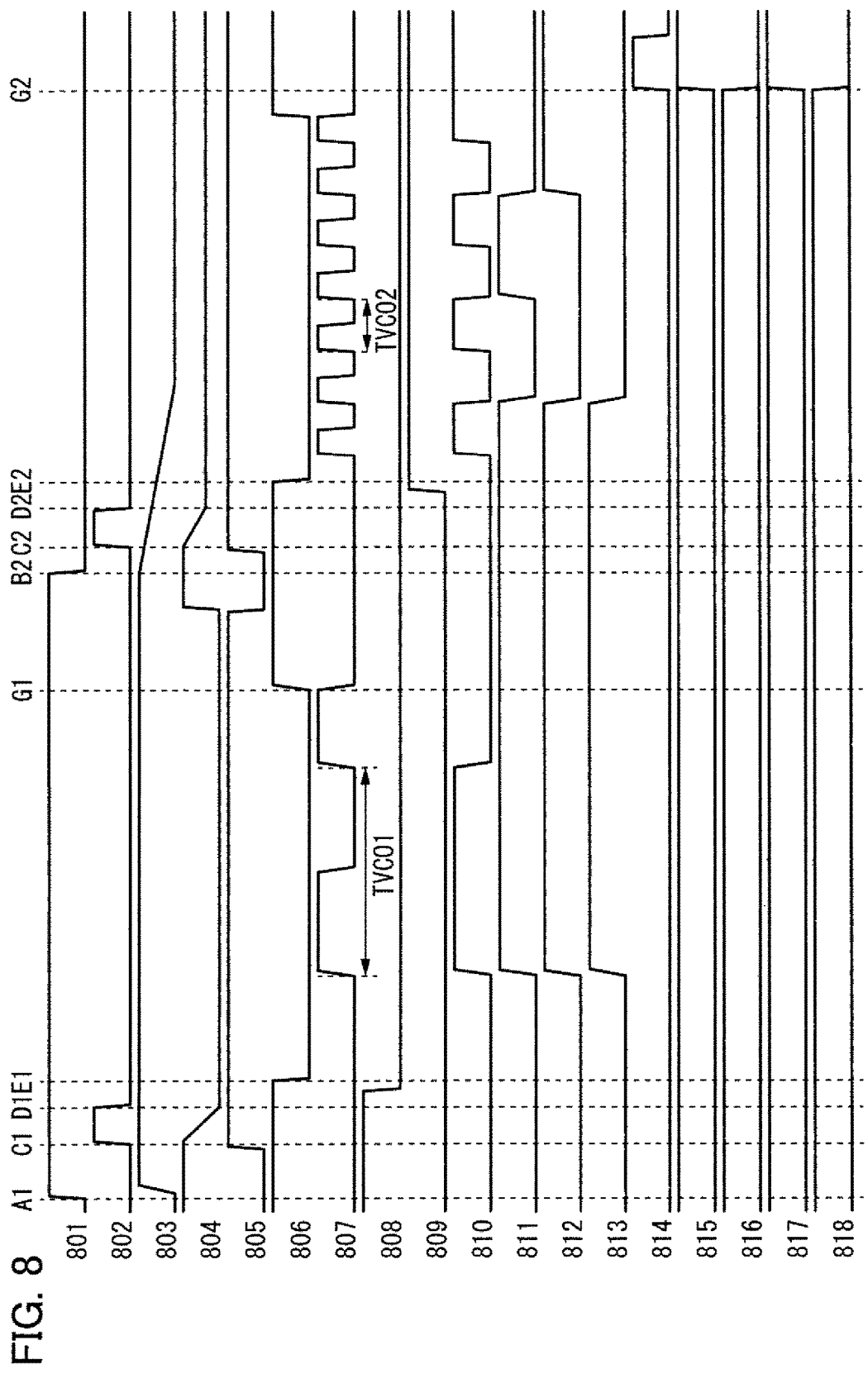
FIG. 8 illustrates an example of a timing chart of a semiconductor device including a photo sensor.

Next, an example of the readout operation of the photo sensor is described in detail with reference to a timing chart in FIG. 8. In FIG. 8, signals 801 to 804 correspond to the potential of the photodiode reset signal line 208, the potential of the wiring (gate signal line) 209 electrically connected to the gate of the transistor 206, the potential of the wiring 213 electrically connected to the gate of the transistor 205, and the potential of the photo sensor output signal line 211 in FIG. 2, respectively. In addition, a signal 805 corresponds to the potential of the first auxiliary readout circuit control signal line 351 in FIG. 6. Further, signals 806 to 818 correspond to the potential of the stop signal line 404, the potential of the output signal line 403 of the VCO, the potential of the reset signal line 405, the potential of the count-value increase and decrease control signal line 407, the potential of the signal line 531, the potential of the signal line 532, the potential of the signal line 533, the potential of the signal line 534, the potential of the set signal line 406, the potential of the zeroth bit signal line 535, the potential of the first bit signal line 536, the potential of the second bit signal line 537, and the potential of the third bit signal line 538 in FIG. 5, respectively.

First, at a time A1, when the potential of the photodiode reset signal line 208 (the signal 801) is "H", the photodiode 204 is brought into conduction and the potential of the wiring 213 electrically connected to the gate of the transistor 205 (the signal 803) is "H". In addition, when the potential of the first auxiliary readout circuit control signal line 351 (the signal 805) is "L", the potential of the photo sensor output signal line 211 (the signal 804) is precharged to "H".

At a time C1, when the potential of the gate signal line 209 (the signal 802) is "H", the transistor 206 is turned on and the photo sensor reference signal line 212 and the photo sensor output signal line 211 are brought into conduction through the transistor 205 and the transistor 206. In this embodiment, the potential of the photo sensor reference signal line 212 is lower than the potential of the gate signal line 209 that is "H"; thus, the potential of the photo sensor output signal line 211 (the signal 804) is gradually lowered from "H". Note that before the time C1, the potential of the first auxiliary readout circuit control signal line 351 (the signal 805) is "H" and precharge of the photo sensor output signal line 211 is terminated.

At a time D1, when the potential of the gate signal line 209 (the signal 802) is "L", the transistor 206 is turned off, so that the potential of the photo sensor output signal line 211 (the signal 804) is kept at a fixed level after the time D1. Note that the potential of the photodiode reset signal line 208 (the signal 801) is kept at "H"; thus, the potential of the photo sensor output signal line 211 is a potential when light does not enter the photodiode, i.e., when a black image is taken.

At a time E1, when the potential of the stop signal line 404 (the signal 806) is changed from "H" to "L", the VCO 401 starts to oscillate at oscillation frequency which is based on the potential of the photo sensor output signal line 211 (the signal 804) and the output signal becomes like the signal 807. Here, when the oscillation cycle of the VCO is denoted by TVCO1, the oscillation frequency of the VCO is 1/TVCO1.

Note that in the case where the potential of the reset signal line 405 (the signal 808) is changed from "H" to "L" before the time E1, the addition/subtraction counter starts counting at the same time as the oscillation of the VCO 401. Here, the potential of the count-value increase and decrease control signal line 407 (the signal 809) is "L"; thus, the addition/subtraction counter operates as a subtraction counter. In other words, every time the output signal of the VCO 401 is changed from "L" to "H", the count value is decreased by one. Note that when the potential of the reset signal line 405 (the signal 808) is "H", the addition/subtraction counter is set to a first initial value "0000"; thus, the potentials of the signal lines 531 to 534 (the signals 809 to 812) are all "L".

At a time G1, when the potential of the stop signal line 404 (the signal 806) is "H", the oscillation of the VCO 401 and the counting in the addition/subtraction counter are stopped.

As described above, operation (hereinafter referred to as "first operation") where first selection operation is performed from the time C1 to the time D1 and first A/D conversion is performed from the time E1 to the time G1 while the potential of the photodiode reset signal line 208 (the signal 801) is kept at "H" and A/D conversion is performed using the addition/subtraction counter as a subtraction counter in the first A/D conversion is one of the features of the method for driving the semiconductor device in this embodiment. Further, in this specification, the state of the photo sensor at the time of the first operation is referred to as a "first state".

In addition, in the driving method, light does not enter the photodiode, that is, a black image is taken. Therefore, ideally, the oscillation of the VCO 401 is stopped and the count value (a first count value) in the addition/subtraction counter at the time G1 is kept at the first initial value "0000". However, if there is noise caused by variation or the like of the photo sensor, the count value in the addition/subtraction counter at the time G1 is smaller than "0000" depending on the degree of the noise. Here, as negative values which are smaller than "0000", −1, −2, −3 can be expressed as "1111", "1110", and "1101", respectively. For example, as the degree of "excessive whitening" (a phenomenon that a black image which is taken looks whitish) when the black image is taken in a display device including a photo sensor becomes higher, the count value in the addition/subtraction counter becomes smaller than "0000".

Next, at a time B2, when the potential of the photodiode reset signal line 208 (the signal 801) is "L", the potential of the wiring 213 electrically connected to the gate of the transistor 205 (the signal 803) starts to be lowered due to the off-state current of the photodiode 204. The off-state current of the photodiode 204 is increased when light enters the photodiode 204. The potential of the wiring 213 electrically connected to the gate of the transistor 205 (the signal 803) varies depending on the amount of light which enters the photodiode 204. In other words, the amount of current flowing between the source and the drain of the transistor 205 varies depending on the amount of light which enters the photodiode 204.

At a time C2, when the potential of the gate signal line 209 (the signal 802) is "H", the transistor 206 is turned on and the photo sensor reference signal line 212 and the photo sensor output signal line 211 are brought into conduction through the transistor 205 and the transistor 206. Then, the potential of the photo sensor output signal line 211 (the signal 804) is lowered. Note that before the time C2, the potential of the first auxiliary readout circuit control signal line 351 (the signal 805) is changed from "L" to "H" and precharge of the photo sensor output signal line 211 is terminated. Here, the rate at which the potential of the photo sensor output signal line 211 (the signal 804) is lowered depends on the current flowing between the source and the drain of the transistor 205. That is, the larger the amount of light which enters the photodiode 204 becomes, the lower the rate at which the potential of the photo sensor output signal line 211 (the signal 804) is lowered becomes.

At a time D2, when the potential of the gate signal line 209 (the signal 802) is "L", the transistor 206 is turned off, so that the potential of the photo sensor output signal line 211 (the signal 804) is kept at a fixed level after the time D2.

At a time E2, when the potential of the stop signal line 404 (the signal 806) is changed from "H" to "L", the VCO 401 starts to oscillate at oscillation frequency which is based on the potential of the photo sensor output signal line 211 (the signal 804) and the output signal becomes like the signal 807. Here, when the oscillation cycle of the VCO is denoted by TVCO2, the oscillation frequency of the VCO is 1/TVCO2.

At the time E2, the potential of the reset signal line 405 (the signal 808) is "L", and the addition/subtraction counter starts counting at the same time as the oscillation of the VCO 401. Here, the potential of the count-value increase and decrease control signal line 407 (the signal 809) is "H", and the addition/subtraction counter operates as an addition counter. In other words, every time the output signal of the VCO 401 is changed from "L" to "H", the count value is increased by one. Note that the count value of the addition/subtraction counter is the first count value at the time E2, and the addition/subtraction counter performs counting with the first count value used as a second initial value after the time E2.

At a time G2, when the potential of the set signal line 406 (the signal 814) is changed from "L" to "H", the count values in the addition/subtraction counter, i.e., the values of the signal lines 531 to 534 are stored in the first to fourth flip-flops 523 to 526, so that the potentials of the zeroth to third bit signal lines 535 to 538 (the signals 815 to 818) are changed. Here, the potentials of the zeroth to third bit signal lines 535 to 538 are "H", "L", "H", and "L", respectively. They are "5" in decimal notation.

As described above, operation (hereinafter referred to as "second operation") where second selection operation is performed from the time C2 to the time D2 and second A/D conversion is performed from the time E2 to the time G2 and A/D conversion is performed using the addition/subtraction counter as an addition counter in the second A/D conversion is one of the features of the method for driving the semiconductor device in this embodiment. Further, in this specification, the state of the photo sensor at the time of the second operation is referred to as a "second state".

In this embodiment, when the second A/D conversion is performed using the count value obtained by the first A/D conversion as the second initial value, a count value from which an error generated due to noise caused by variation or the like in characteristics of the photo sensor or the A/D converter is subtracted can be obtained. In other words, noise in a semiconductor device including a photo sensor can be reduced.

Note that in the driving method, the second operation is performed after the first operation; however, the present invention is not limited to this driving method. In other words, in the present invention, the first operation can be performed after the second operation.

In addition, in the first operation, the count value in the counter is obtained on the assumption that light does not enter the photo sensor 106; however, the present invention is not limited to this structure. In other words, in the present invention, in the first operation, the count value in the counter can be obtained on the assumption that light intense enough to make a count value in the semiconductor device including a photo sensor the largest enters the photo sensor 106. In order to obtain the count value in the counter on the assumption that light intense enough to make the count value in the semiconductor device including a photo sensor the largest enters the photo sensor 106, for example, the potential of the photodiode reset signal line 208 is "L", and the potential of the wiring 213 is "L" after a great deal of time passes. Note that in that case, in the first operation, the addition/subtraction counter performs counting while the first initial value is "1111" and the addition/subtraction counter is used as a subtraction counter.

Figure 2:
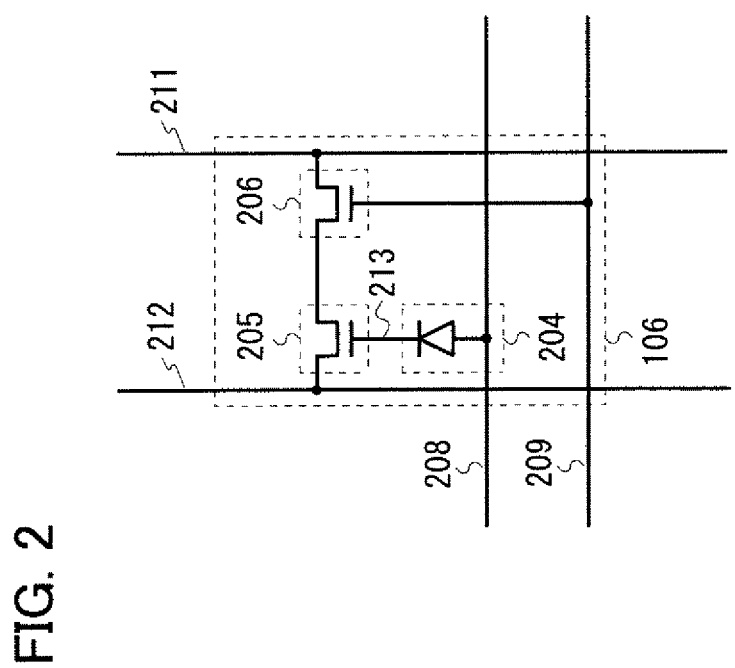
FIG. 2 illustrates an example of the photo sensor.

Note that in the case where the off-state current of the transistor 205 greatly varies or in the case where dark current of the photodiode 204 or photocurrent by weak light of the photodiode 204 greatly varies in the photo sensor 106 in FIG. 2, the adverse effect of noise caused by variation or the like in characteristics of the photo sensor or the A/D converter can be effectively reduced when the count value in the counter is obtained on the assumption that light does not enter the photo sensor 106 in the first operation. Further, in the case where the threshold voltage of the transistor 205 greatly varies or photocurrent by the intense light of the photodiode 204 greatly varies in the photo sensor 106 in FIG. 2, the adverse effect of noise can be effectively reduced when the count value in the counter is obtained on the assumption that light intense enough to make the count value in the semiconductor device including a photo sensor the largest enters the photo sensor 106 in the first operation.

Comparative Example

Figure 7:
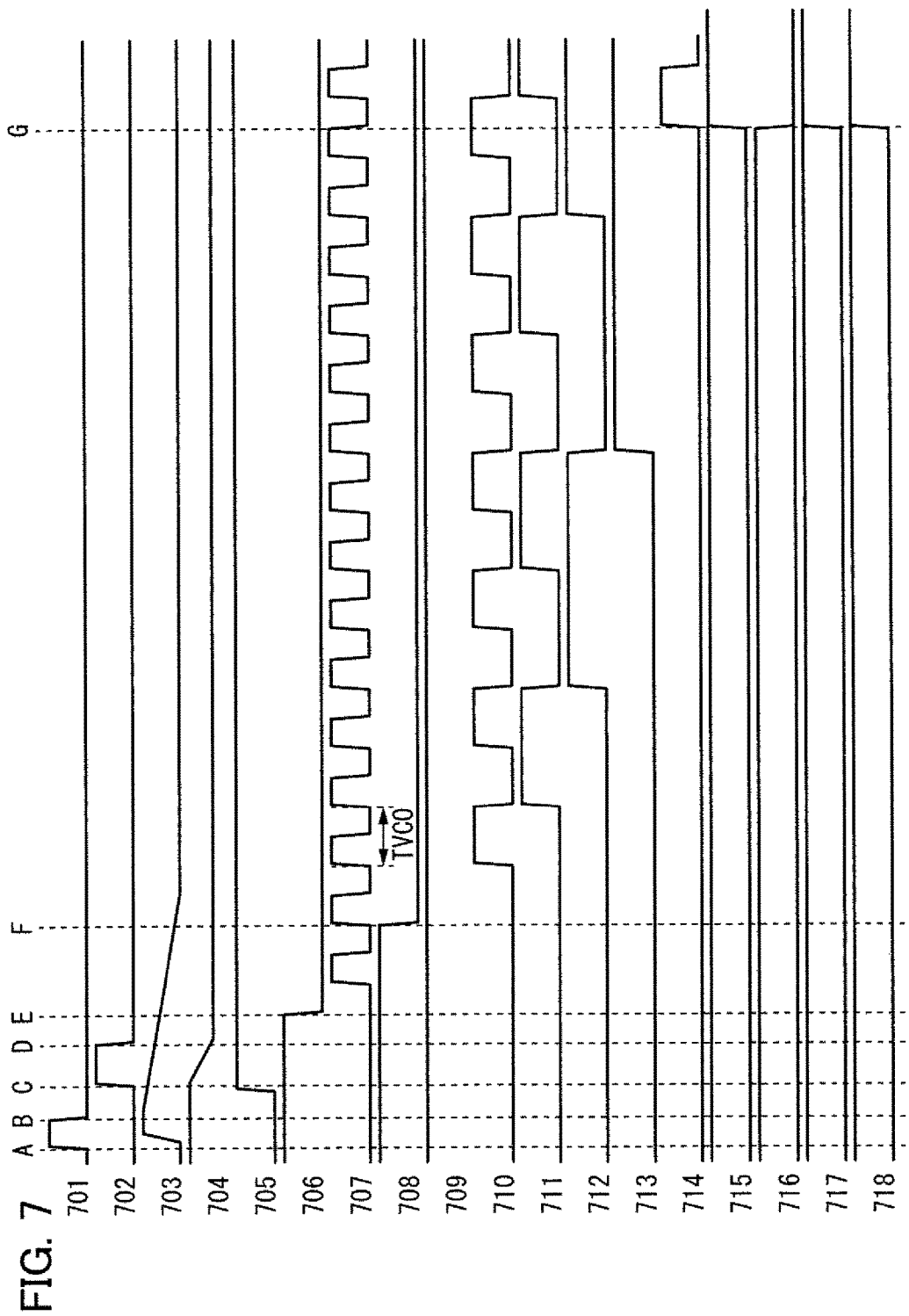
FIG. 7 illustrates an example of a timing chart of a semiconductor device including a photo sensor.

Next, an example of the readout operation of the photo sensor when the output value of the A/D converter is not corrected is described with reference to a timing chart in FIG. 7. In FIG. 7, signals 701 to 704 correspond to the potential of the photodiode reset signal line 208, the potential of the gate signal line 209 electrically connected to the gate of the transistor 206, the potential of the wiring 213 electrically connected to the gate of the transistor 205, and the potential of the photo sensor output signal line 211 in FIG. 2, respectively. In addition, a signal 705 corresponds to the potential of the first auxiliary readout circuit control signal line 351 in FIG. 6. Further, signals 706 to 718 correspond to the potential of the stop signal line 404, the potential of the output signal line 403 of the VCO, the potential of the reset signal line 405, the potential of the count-value increase and decrease control signal line 407, the potential of the signal line 531, the potential of the signal line 532, the potential of the signal line 533, the potential of the signal line 534, the potential of the set signal line 406, the potential of the zeroth bit signal line 535, the potential of the first bit signal line 536, the potential of the second bit signal line 537, and the potential of the third bit signal line 538 in FIG. 5, respectively.

At a time A, when the potential of the photodiode reset signal line 208 (the signal 701) is "H", the photodiode 204 is brought into conduction and the potential of the wiring 213 electrically connected to the gate of the transistor 205 (the signal 703) is "H". In addition, when the potential of the first auxiliary readout circuit control signal line 351 (signal 705) is "L", the potential of the photo sensor output signal line 211 (the signal 704) is precharged to "H".

At a time B, when the potential of the photodiode reset signal line 208 (the signal 701) is "L", the potential of the wiring 213 electrically connected to the gate of the transistor 205 (the signal 703) starts to be lowered due to the off state current of the photodiode 204. The off-state current of the photodiode 204 is increased when light enters the photodiode 204. The potential of the wiring 213 electrically connected to the gate of the transistor 205 (the signal 703) varies depending on the amount of light which enters the photodiode 204. In other words, the amount of current flowing between the source and the drain of the transistor 205 varies depending on the amount of light which enters the photodiode 204.

At a time C, when the potential of the gate signal line 209 (the signal 702) is "H", the transistor 206 is turned on and the photo sensor reference signal line 212 and the photo sensor output signal line 211 are brought into conduction through the transistor 205 and the transistor 206. Then, the potential of the photo sensor output signal line 211 (the signal 704) is lowered. Note that before the time C, the potential of the first auxiliary readout circuit control signal line 351 (the signal 705) is "H" and precharge of the photo sensor output signal line 211 is terminated. Here, the rate at which the potential of the photo sensor output signal line 211 (the signal 704) is lowered depends on the amount of current flowing between the source and the drain of the transistor 205. That is, the larger the amount of light which enters the photodiode 204 becomes, the lower the rate at which the potential of the photo sensor output signal line 211 (the signal 704) is lowered becomes.

At a time D, when the potential of the gate signal line 209 (the signal 702) is "L", the transistor 206 is turned off, so that the potential of the photo sensor output signal line 211 (the signal 704) is kept at a fixed level after the time D.

At a time E, when the potential of the stop signal line 404 (the signal 706) is changed from "H" to "L", the VCO 401 starts to oscillate at oscillation frequency which is based on the potential of the photo sensor output signal line 211 (the signal 704) and the output signal of the VCO 401 becomes like the signal 707. Here, when the oscillation cycle of the VCO is denoted by TVCO, the oscillation frequency of the VCO is 1/TVCO.

At a time F, when the potential of the reset signal line 405 (the signal 708) is changed from "H" to "L", the addition/subtraction counter starts counting. Here, the potential of the count-value increase and decrease control signal line 407 (the signal 709) is "H" at the time F; thus, the addition/subtraction counter operates as an addition counter. In other words, every time the output signal of the VCO 401 is changed from "L" to "H", the count value is increased by one. Note that when the potential of the reset signal line 405 is "H", the addition/subtraction counter is set to the initial value "0000"; thus, the potentials of the signal lines 531 to 534 (the signals 710 to 713) are all "L". Note that by making timing of when the potential of the reset signal line 405 (the signal 708) is changed from "H" to "L" come at the same time as or earlier than timing of when the potential of the stop signal line 404 (the signal 706) is changed from "H" to "L", a period during which the addition/subtraction counter performs counting can be made long. Therefore, an ADC with high throughput can be realized, which is preferable.

At a time G, when the potential of the set signal line 406 (the signal 714) is changed from "L" to "H", the count values of the addition/subtraction counter, i.e., the values of the signal lines 531 to 534 are stored in the first to fourth flip-flops 523 to 526, so that the potentials of the zeroth to third bit signal lines 535 to 538 (the signals 715 to 718) are changed. Here, the potentials of the zeroth to third bit signal lines 535 to 538 are "H", "L", "H", and "H", respectively. They are "13" in decimal notation.

Note that in the above description, operation performed from the time A to the time B, operation performed from the time B to the time C, operation performed from the time C to the time D, and operation performed from the time F to the time G are referred to as reset operation, accumulation operation, selection operation, and A/D conversion, respectively.

By the driving method described as the comparative example, data (an analog signal) that is related to an object to be detected and is obtained from a photo sensor can be converted into a digital signal to be output. However, the digital signal obtained by the driving method reflects various kinds of variations caused by a manufacture process, such as variation in characteristics (e.g., threshold voltage or on-state current) of a transistor included in a photo sensor in each pixel, variation in characteristics (e.g., photocurrent) of a photodiode, variation in resistance load and parasitic capacitance of a readout signal line, and variation in an A/D converter. Therefore, for example, in the case where such a driving method is employed in a display device including photo sensors, noise (fixed pattern noise) caused by variation in photo sensors appears in a taken image like a pattern, so that a white pattern might appear even when a fully black image is taken or a black pattern might appear even when a fully white image is taken.

Embodiment 2

In this embodiment, an example of the structure of a semiconductor device which is one embodiment of the present invention is described. Specifically, an example of a display device (a touch panel) including a pixel portion having a photo sensor is described.

Figure 9:
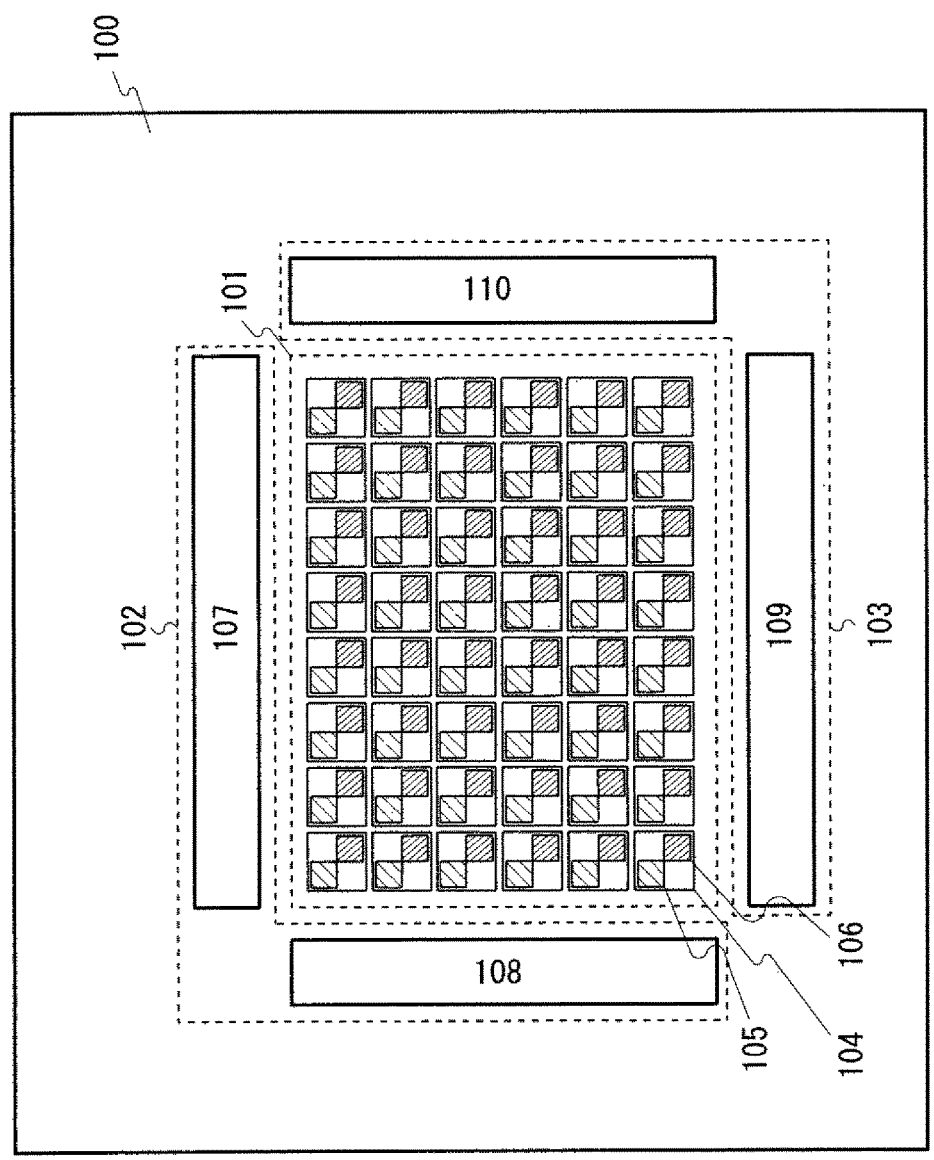
FIG. 9 illustrates an example of a display device including a photo sensor.

As illustrated in FIG. 9, a touch panel 100 in this embodiment includes a pixel portion 101, a display element control circuit 102, and the photo sensor control circuit 103. The pixel portion 101 includes a plurality of pixels 104 arranged in matrix. The pixel 104 includes a display element 105 and the photo sensor 106. However, the present invention is not limited to this structure. In other words, in this embodiment, in the pixel portion 101, the number of the display elements 105 (here, 1) corresponds to the number of the photo sensors 106 (here, 1); however, the present invention is not limited to this structure. In addition, in this embodiment, the display element 105 and the photo sensor 106 are provided in one region (the pixel portion 101); however, the present invention is not limited to this structure. A display portion of an image in which the display element 105 is provided and an area sensor portion in which the photo sensor 106 is provided may be provided in different regions.

The display element 105 includes a switching element, a storage capacitor, a liquid crystal element including a liquid crystal layer, a color filter, and the like. A transistor can be typically used as the switching element. Specifically, a thin film transistor or the like can be used as the switching element. In a liquid crystal display device, taking advantage of the change in the direction of polarization of light entering a liquid crystal layer by application of voltage to the liquid crystal layer, the contrast (gradation) of light passing through the liquid crystal layer is made, so that images are displayed. Light emitted from a rear side of the liquid crystal display device by a light source (a backlight) or/and outside light are used as the light passing through the liquid crystal layer. Further, when the light passing through the liquid crystal layer passes through the color filter, the gray level of a particular color (e.g., red (R), green (G), or blue (B)) can be produced and a color image is displayed. The storage capacitor has a function of holding electrical charges which correspond to voltage applied to the liquid crystal layer. The transistor has a function of controlling injection or ejection of electrical charges into/from the storage capacitor.

Note that although the display element 105 includes a liquid crystal element, the display element 105 may include a different element such as a light-emitting element instead of the liquid crystal element. A light-emitting element is an element whose luminance is controlled by current or voltage. Specific examples of the light-emitting element include an organic light-emitting diode (OLED) and an inorganic electroluminescence (EL) element.

The display element control circuit 102 controls the display element 105 and includes a display element driver circuit 107 which inputs a signal to the display element 105 through a signal line such as a video data signal line (also referred to as a source signal line), and a display element driver circuit 108 which inputs a signal to the display element 105 through a scan line (also referred to as a gate signal line). For example, the display element driver circuit 108 on the scan line side has a function of selecting display elements included in the pixels arranged in a particular row. The display element driver circuit 107 on the signal line side has a function of applying a given potential to the display elements included in the pixels arranged in the selected row. Note that in the display element to which a high potential is applied by the display element driver circuit 108 on the scan line side, the transistor is turned on, so that the display element is supplied with an electrical charge from the display element driver circuit 107 on the signal line side.

Figure 10:
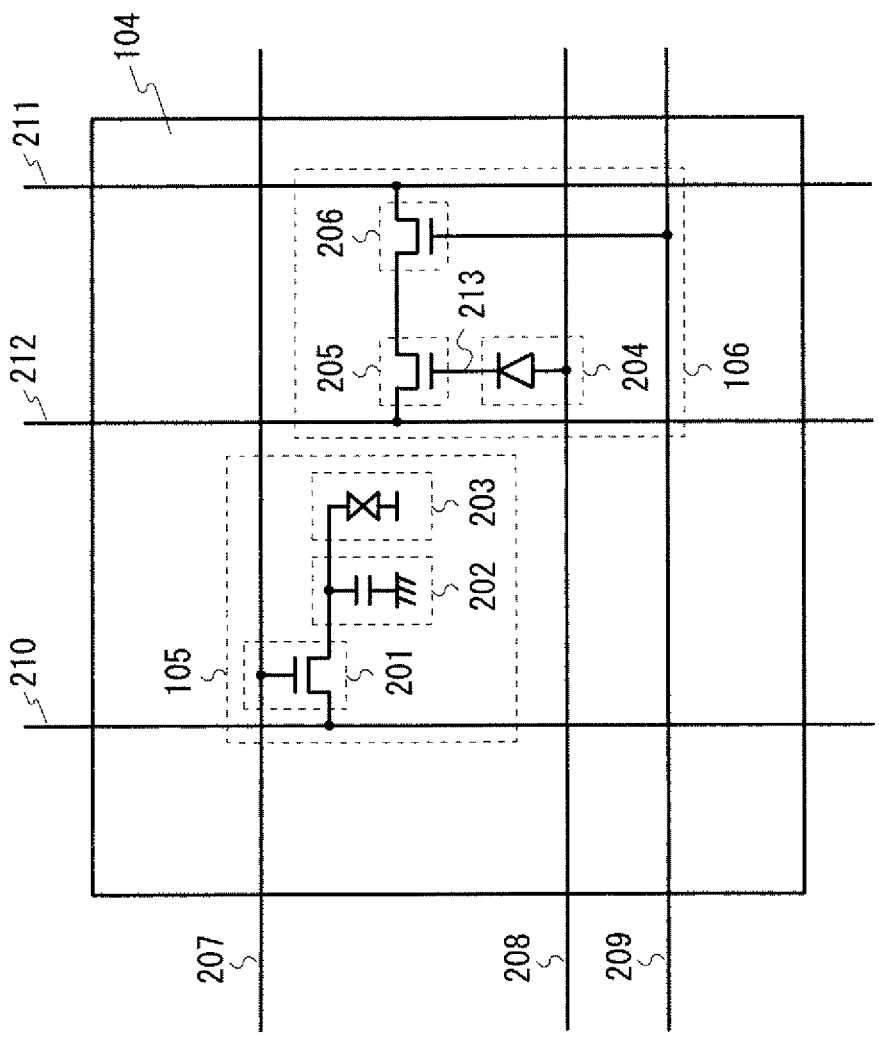
FIG. 10 illustrates an example of the pixel including a photo sensor.

Next, an example of the circuit diagram of the pixel 104 is described with reference to FIG. 10. The pixel 104 includes the display element 105 having a transistor 201, a storage capacitor 202, and a liquid crystal element 203, and the photo sensor 106 having the photodiode 204, the transistor 205, and the transistor 206.

A gate of the transistor 201 is electrically connected to a gate signal line 207. One of a source and a drain of the transistor 201 is electrically connected to a video data signal line 210. The other of the source and the drain of the transistor 201 is electrically connected to one electrode of the storage capacitor 202 and one electrode of the liquid crystal element 203. The other electrode of the storage capacitor 202 and the other electrode of the liquid crystal element 203 are each held at a certain potential. The liquid crystal element 203 includes a pair of electrodes and a liquid crystal layer provided between the pair of electrodes.

When "H" (a high potential) is applied to the gate signal line 207, the transistor 201 applies the potential of the video data signal line 210 to the storage capacitor 202 and the liquid crystal element 203. The storage capacitor 202 holds the applied potential. The transmittance of the liquid crystal element 203 is changed in accordance with the applied potential.

Note that the structure of the photo sensor 106, the driving method (the readout operation), and the like can be the same as those described in Embodiment 1; thus, description thereof is omitted in this embodiment. When a display device including a photo sensor is driven in a manner similar to that in Embodiment 1, noise can be reduced and highly accurate images can be obtained.

Embodiment 3

In this embodiment, an example of the structure of a semiconductor device which is one embodiment of the present invention is described. Specifically, a circuit structure which is different from the circuit structure of the photo sensor 106 in Embodiment 1 is described.

Figure 11A:
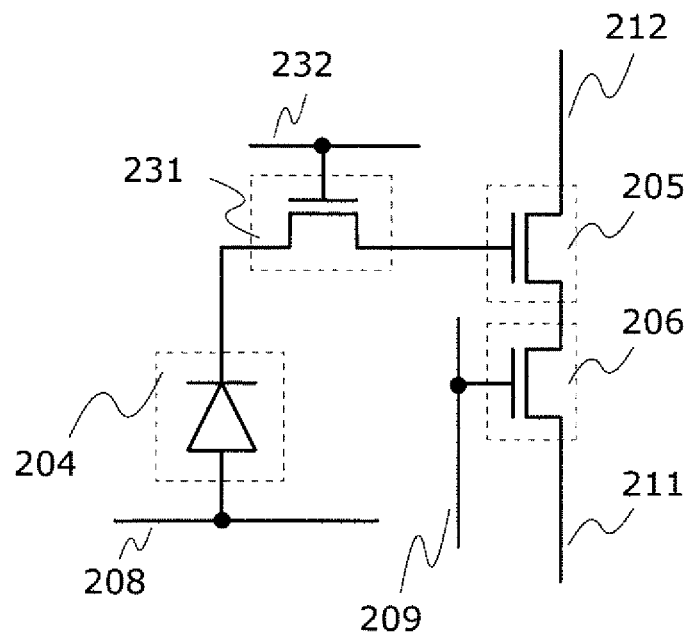
FIGS. 11A and 11B illustrate examples of photo sensors.

A photo sensor illustrated in FIG. 11A corresponds to the photo sensor 106 in FIG. 2 in Embodiment 1, where a transistor 231 is provided between the cathode of the photodiode 204 and the gate of the transistor 205. One of a source and a drain of the transistor 231 is electrically connected to the cathode of the photodiode 204. The other of the source and the drain of the transistor 231 is electrically connected to the gate of the transistor 205. A gate of the transistor 231 is electrically connected to a wiring 232.

The transistor 231 has a function of holding electrical charges accumulated in the gate of the transistor 205. Therefore, in a period during which the transistor 231 is off, the amount of current flowing between the source and the drain of the transistor 231 is preferably as small as possible. That is, it is preferable that the off-state current of the transistor 231 be significantly low. Front this perspective, the transistor 231 preferably includes an oxide semiconductor layer for a channel formation region. More preferably, the channel formation region of each of the transistor 205 and the transistor 206 includes a crystalline semiconductor layer (preferably a crystalline silicon layer such as a single crystal silicon layer) and the channel formation region of the transistor 231 includes an oxide semiconductor layer. With such a structure, a signal can be quickly output from the photo sensor 106 to the photo sensor output signal line 211 in a period during which the transistor 231 is on, and the electrical charges accumulated in the gate of the transistor 205 can be prevented from leaking in the period during which the transistor 231 is off. However, the present invention is not limited to this structure. For example, the transistor 231 can include a different semiconductor layer containing silicon (preferably crystalline silicon such as single crystal silicon) or the like.

Next, an example of a method for driving the photo sensor 106 illustrated in FIG. 11A is described with reference to a timing chart in FIG. 14. Note that the timing chart shown in FIG. 14 has a lot in common with the timing chart shown in FIG. 8; thus, different operations are extracted.

Figure 14:
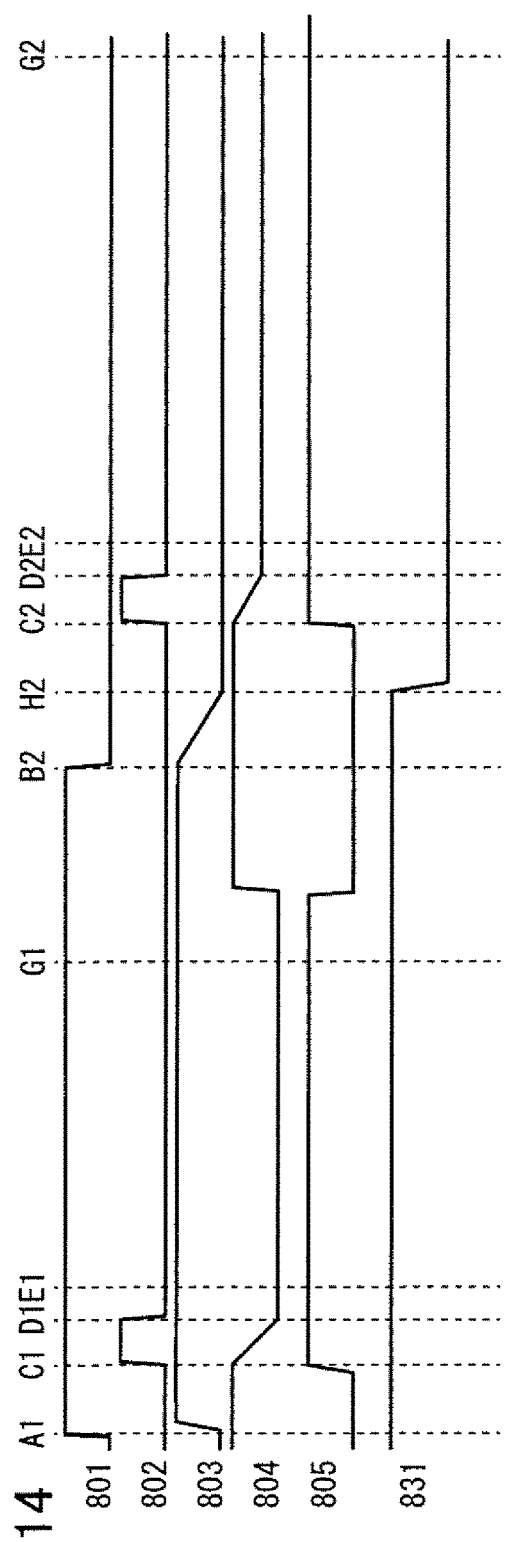
FIG. 14 illustrates an example of a timing chart of a semiconductor device including a photo sensor.

In FIG. 14, the signals 801 to 804 correspond to the potential of the photodiode reset signal line 208, the potential of the gate signal line 209 electrically connected to the gate of the transistor 206, the potential of the gate of the transistor 205, and the potential of the photo sensor output signal line 211 in FIG. 11A, respectively. In addition, the signal 805 corresponds to the potential of the first auxiliary readout circuit control signal line 351 in FIG. 6. Further, a signal 831 corresponds to the potential of the wiring 232 in FIG. 11A (i.e., a potential applied to the gate of the transistor 231).

First, first operation in the photo sensor 106 illustrated in FIG. 11A may be similar to the first operation in the photo sensor 106 illustrated in FIG. 2 in Embodiment 1; thus, description of the first operation is omitted.

At the time B2, when the potential of the photodiode reset signal line 208 (the signal 801) is changed from "H" to "L", the potential of the gate of the transistor 205 (the signal 803) starts to be lowered due to the off-state current of the transistor 204. In that case, the potential of the gate of the transistor 231 (the signal 831) is "H", and the transistor 231 is on. The off-state current of the photodiode 204 is increased when light enters the photodiode 204. The potential of the gate of the transistor 205 (the signal 803) varies depending on the amount of light which enters the photodiode 204. In other words, the amount of current flowing between the source and the drain of the transistor 205 varies depending on the amount of light which enters the photodiode 204.

Then, at a time H2, when the potential of the gate of the transistor 231 is "L", the transistor 231 is turned off, so that the potential of the gate of the transistor 205 (the signal 803) is kept at a fixed level after the time H2.

Here, in the case where the off-state current of the transistor 231 is high, it is difficult to keep the potential of the gate of the transistor 205 at a fixed level. Therefore, as described above, the transistor 231 preferably includes an oxide semiconductor layer for the channel formation region. When a transistor which includes an oxide semiconductor layer for a channel formation region is used as the transistor 231, the function of holding electrical charges accumulated in the gate of the transistor 205 can be improved. Therefore, the photo sensor 106 can accurately convert incident light into an electric signal.

At the time C2, when the potential of the gate signal line 209 (the signal 802) is "H", the transistor 206 is turned on and the photo sensor reference signal line 212 and the photo sensor output signal line 211 are brought into conduction through the transistor 205 and the transistor 206. Then, the potential of the photo sensor output signal line 211 (the signal 804) is lowered. Note that before the time C2, the potential of the first auxiliary readout circuit control signal line 351 (the signal 805) is changed from "H" to "L" and precharge of the photo sensor output signal line 211 is terminated. Here, the rate at which the potential of the photo sensor output signal line 211 (the signal 804) is lowered depends on the current flowing between the source and the drain of the transistor 205. That is, the larger the amount of light which enters the photodiode 204 becomes, the lower the rate at which the potential of the photo sensor output signal line 211 (the signal 804) is lowered becomes.

At the time D2, when the potential of the gate signal line 209 (the signal 802) is "L", the transistor 206 is turned off, so that the potential of the photo sensor output signal line 211 (the signal 804) is kept at a fixed level after the time D2.

Operation performed after the time D2 may be similar to the second operation in the photo sensor 106 illustrated in FIG. 2 in Embodiment 1; thus, description thereof is omitted here.

Figure 11B:
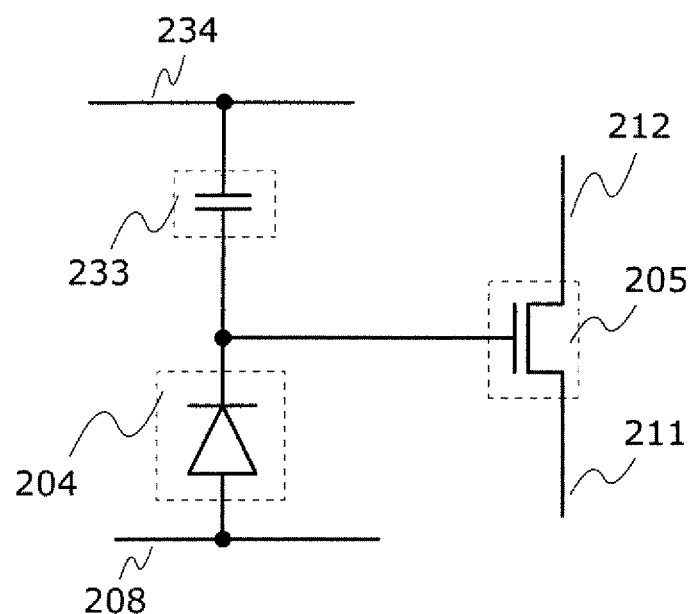

Then, a photo sensor illustrated in FIG. 11B includes the photodiode 204, the transistor 205, and a capacitor 233. The one electrode (the anode) of the photodiode 204 is electrically connected to the wiring 208, and the other electrode (the cathode) of the photodiode 204 is electrically connected to the gate of the transistor 205. The one of the source and the drain of the transistor 205 is electrically connected to the wiring 212, and the other of the source and the drain of the transistor 205 is electrically connected to the photo sensor output signal line 211. The capacitor 233 includes a pair of electrodes. One electrode of the capacitor 233 is electrically connected to the other electrode (the cathode) of the photodiode 204. The other electrode of the capacitor 233 is electrically connected to a wiring 234.

Figure 12A:
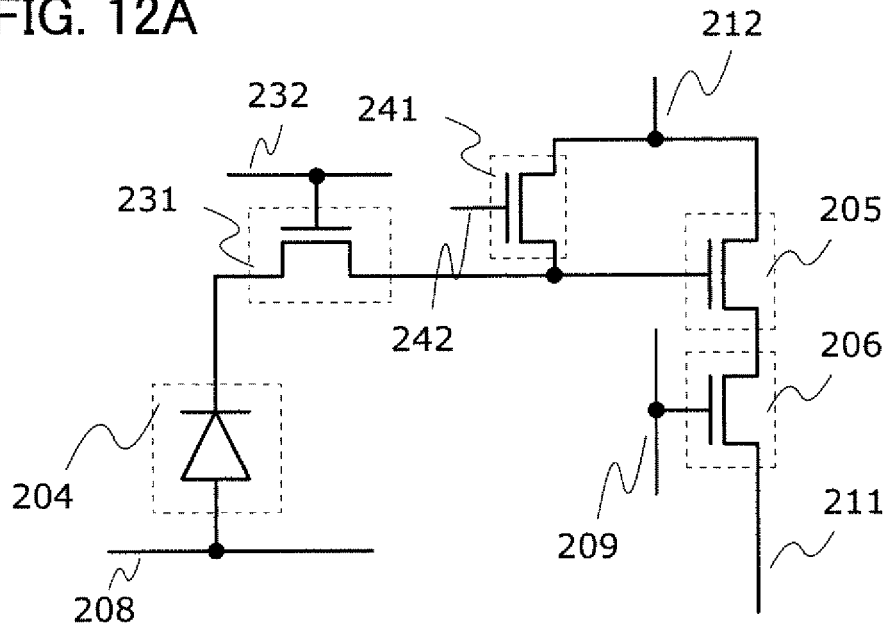
FIGS. 12A and 12B illustrate examples of photo sensors.

A photo sensor illustrated in FIG. 12A corresponds to a structure including a transistor 241 in addition to the photo sensor illustrated in FIG. 11A. One of a source and a drain of the transistor 241 is electrically connected to the gate of the transistor 205. The other of the source and the drain of the transistor 241 is electrically connected to the wiring 212. A gate of the transistor 241 is electrically connected to a wiring 242.

The transistor 241 has a function of supplying a reset signal to the gate of the transistor 205. In periods except the period during which the reset signal is supplied, it is preferable that the amount of current flowing between the source and the drain of the transistor 241 be as small as possible in order that the potential of the gate of the transistor 205 does not fluctuate. That is, the transistor 241 preferably has significantly low off-state current. From this perspective, the transistor 241 preferably includes an oxide semiconductor layer for a channel formation region. However, the present invention is not limited to this structure. For example, the transistor 241 can include a different semiconductor layer containing silicon (preferably crystalline silicon such as single crystal silicon) or the like.

Figure 12B:
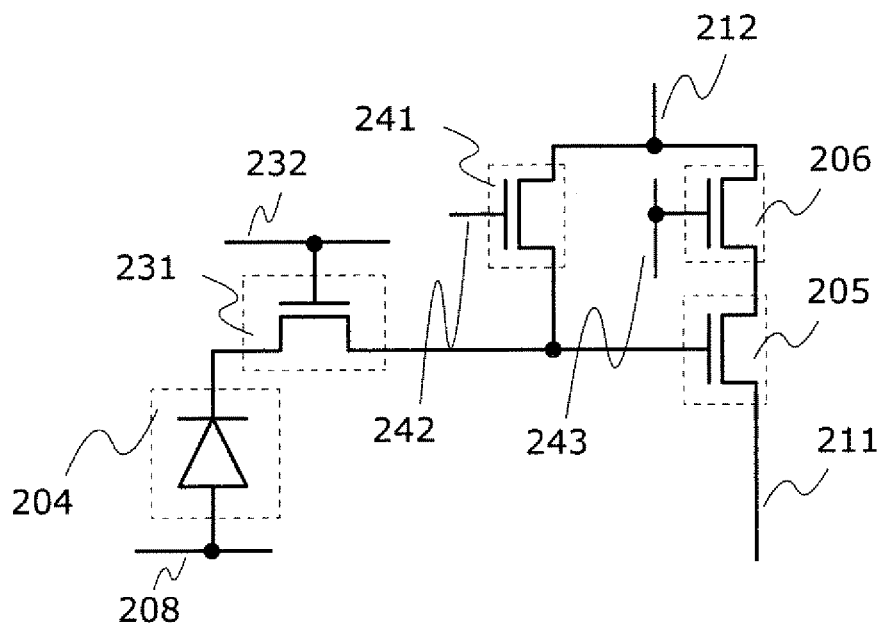

The connection relation of the transistor 205 and the transistor 206 in the photo sensor illustrated in FIG. 12B differs from the connection relation in the photo sensor illustrated in FIG. 12A. In other words, the one of the source and the drain of the transistor 205 is electrically connected to the one of the source and the drain of the transistor 206; the other of the source and the drain of the transistor 205 is electrically connected to the photo sensor output signal line 211; and the gate of the transistor 205 is electrically connected to the one of the source and the drain of the transistor 231. The other of the source and the drain of the transistor 206 is electrically connected to the wiring 212, and the gate of the transistor 206 is electrically connected to a wiring 243.

Figure 13A:
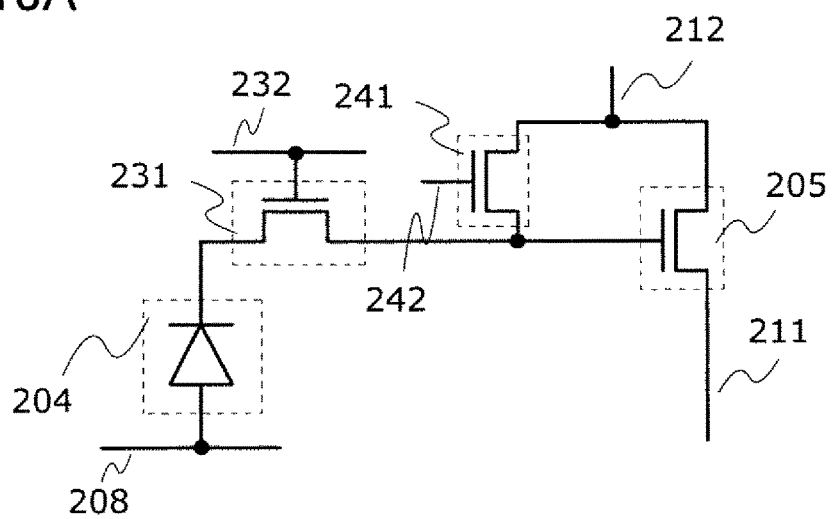
FIGS. 13A to 13C illustrate examples of photo sensors.
Figure 13B:
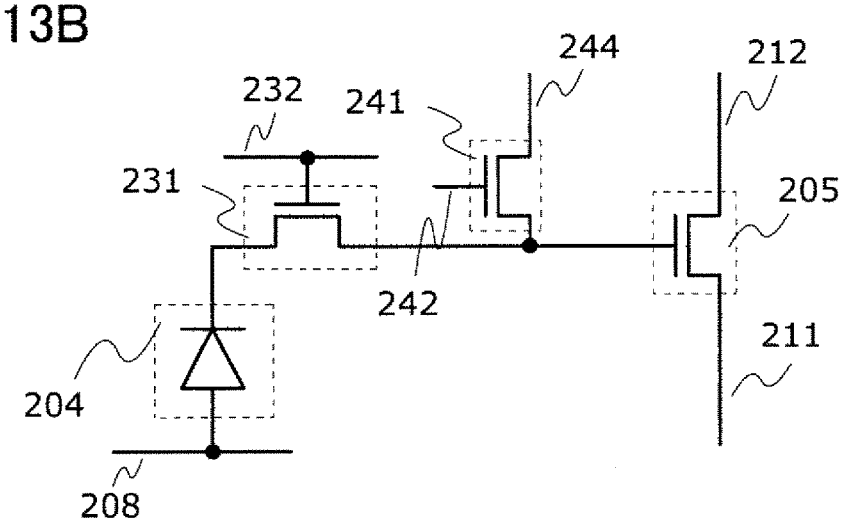

A photo sensor illustrated in FIG. 13A corresponds to the photo sensor illustrated in FIG. 12A from which the transistor 206 is eliminated. In FIG. 13A, the other of the source and the drain of the transistor 241 is electrically connected to the wiring 212 and is supplied with the same potential as the one of the source and the drain of the transistor 205; however, the present invention is not limited to this structure. In other words, like a photo sensor illustrated in FIG. 13B, the other of the source and the drain of the transistor 241 may be electrically connected to a wiring 244 supplied with a potential which is different from the potential of the wiring 212.

Figure 13C:
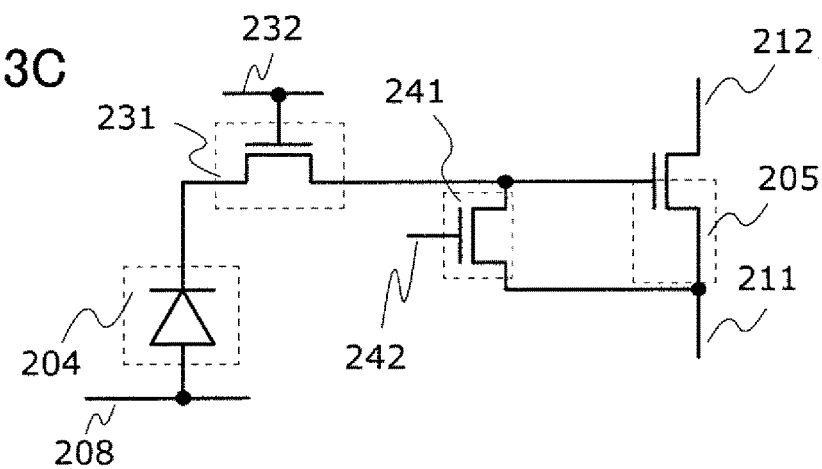

The connection relation of the transistor 241 in the photo sensor illustrated in FIG. 13C differs from the connection relation in the photo sensor illustrated in FIG. 13A. In other words, the one of the source and the drain of the transistor 241 is electrically connected to the gate of the transistor 205; the other of the source and the drain of the transistor 241 is electrically connected to the photo sensor output signal line wiring 211; and the gate of the transistor 241 is electrically connected to the wiring 242.

In this manner, in the present invention, various kinds of circuit structures of photo sensors can be employed. Further, the circuit structure of the photo sensor 106 in Embodiment 1 or 2 can be replaced with any of the circuit structures of the photo sensors that are described in this embodiment.

Embodiment 4

In this embodiment, examples of the structure of a semiconductor device including a photo sensor and a manufacturing method thereof are described. Specifically, examples of the structure of a semiconductor device where the photo sensor illustrated in FIG. 2 in Embodiment 1 is provided over a substrate and a manufacturing method thereof are described.

Figure 15:
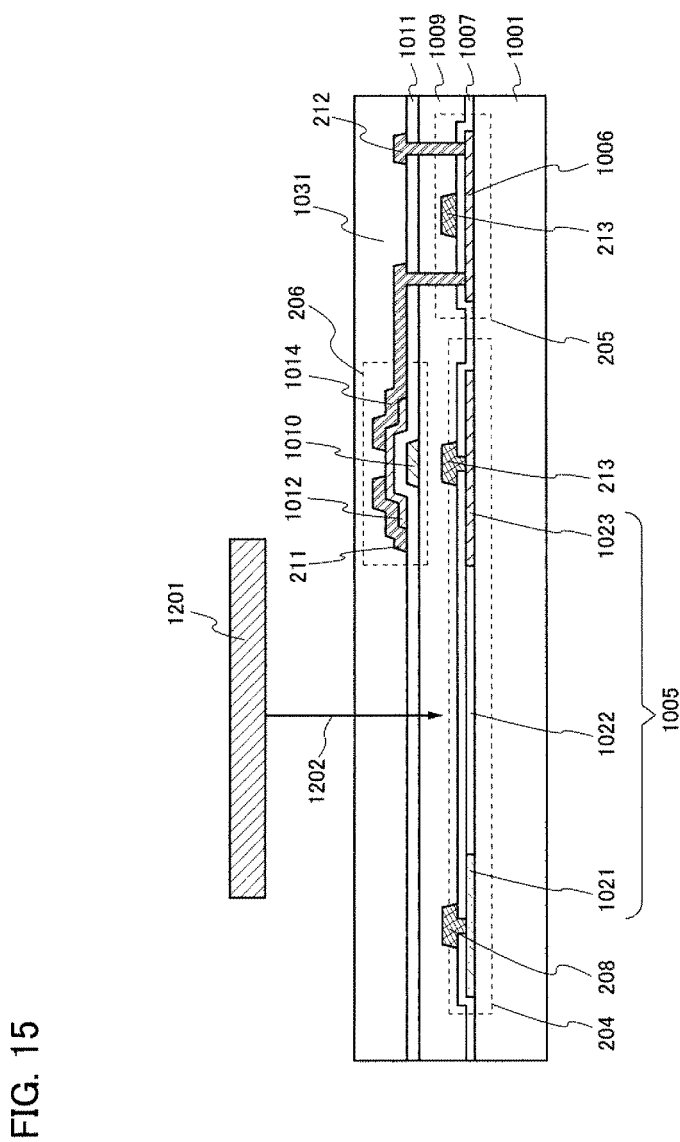
FIG. 15 is a cross-sectional view illustrating an example of a semiconductor device including a photo sensor.

A semiconductor device illustrated in FIG. 15 includes a photo sensor having the photodiode 204, the transistor 205, and the transistor 206 over a substrate 1001.

Although there is no particular limitation on a substrate which can be used as the substrate 1001, it is necessary that the substrate have at least heat resistance high enough to withstand heat treatment to be performed later. In the case where the temperature of the heat treatment to be performed later is high, a substrate whose strain point is higher than or equal to 730° C. is preferably used. Specific examples of the substrate 1001 include a glass substrate, a crystalline glass substrate, a ceramic substrate, a quartz substrate, a sapphire substrate, a plastic substrate, and the like. Further, specific examples of the material of the glass substrate include aluminosilicate glass, aluminoborosilicate glass, and barium borosilicate glass.

The photodiode 204 is a lateral-junction pin diode, which includes a semiconductor layer 1005. The semiconductor layer 1005 includes a region having p-type conductivity (a p-type layer 1021), a region having i-type conductivity (an i-type layer 1022), and a region having n-type conductivity (an n-type layer 1023). Note that the photodiode 204 may be a pn diode. In order to increase the rate of an electric signal generated from incident light (the rate is referred to as quantum efficiency), the semiconductor layer 1005 preferably includes crystalline silicon (e.g., polysilicon or single crystal silicon).

Light 1202 which is light emitted from an object to be detected, outside light reflected by the object to be detected, or light emitted from a light source provided in the semiconductor device and reflected by the object to be detected enters the semiconductor layer 1005 of the photodiode 204. The characteristics of the photodiode 204 vary depending on the amount of the light 1202 which enters the semiconductor layer 1005 of the photodiode 204. Here, it is preferable that a light-blocking film be provided so as to overlap with the semiconductor layer (at least the i-type layer 1022) of the photodiode 204 with an insulating film interposed therebetween in order that light other than light which should be detected by the photodiode 204 does not enter the photodiode. For example, it is preferable that a light-blocking film be provided below the photodiode 204 so as to overlap with the semiconductor layer (at least the i-type layer 1022) of the photodiode 204 with an insulating film interposed therebetween. In the case where a color image is detected using a display device including a photo sensor and a color filter, it is particularly preferable to provide a light-blocking film because mixture of light obtained using color filters with different colors in adjacent pixels can be prevented.

The transistor 205 is a top-gate transistor. The transistor 205 includes a semiconductor layer 1006, an insulating film 1007 which functions as a gate insulating film, and the wiring 213 which functions as a gate electrode. In addition, although there is no particular limitation on the material of the semiconductor layer 1006, a crystalline semiconductor is preferably used in order to realize the transistor 205 having high mobility. More preferably, a polysilicon layer or a single crystal silicon layer is used. Further, the transistor 205 may be a p-channel transistor or an n-channel transistor. In this embodiment, an n-channel transistor including a crystalline silicon layer is used as the transistor 205.

The transistor 206 is a bottom-gate transistor. The transistor 206 includes a semiconductor layer 1012, an insulating film 1011 which functions as a gate insulating film, and a gate electrode 1010. The transistor 206 functions as a switch which selects whether an output signal generated from the transistor 205 is supplied to the photo sensor output signal line 211. The transistor 206 preferably has significantly low off-state current. Therefore, an oxide semiconductor layer is preferably used as the semiconductor layer 1012. More preferably, a high-purity oxide semiconductor layer is used as the semiconductor layer 1012. In this embodiment, an n-channel transistor including a high-purity oxide semiconductor layer is used as the transistor 206.

In addition, the transistor 206 is formed above the photodiode 204 and the transistor 205 with an insulating film 1009 interposed therebetween. When the transistor 206 and the photodiode 204 are formed in different layers in this manner, the area of the photodiode 204 can be increased, so that the amount of light received by the photodiode 204 can be increased.

Further, the transistor 206 is preferably formed so that at least part of the transistor 206 overlaps with the p-type layer 1021 or the n-type layer 1023 of the photodiode 204. Furthermore, the transistor 206 is preferably formed so as not to overlap with the i-type layer 1022 of the photodiode 204. In this embodiment, as illustrated in FIG. 15, at least part of the transistor 206 overlaps with the n-type layer 1023 of the photodiode 204 and the transistor 206 is formed so as not to overlap with the i-type layer 1022 of the photodiode 204. Therefore, the area of the photodiode 204 can be increased and light can be efficiently received. Note that also in the case of a pn diode, when the area where the transistor 206 and a pn junction portion overlap with each other is decreased, light can be efficiently received.

Note that in the high-purity oxide semiconductor layer, impurities that adversely affect the electrical characteristics of a transistor including an oxide semiconductor are reduced to a very low level. As a typical example of an impurity which adversely affects the electrical characteristics, there is hydrogen. Hydrogen is an impurity which might be a carrier donor in an oxide semiconductor. When the oxide semiconductor includes a large amount of hydrogen, the oxide semiconductor might have n-type conductivity. A transistor including an oxide semiconductor which includes a large amount of hydrogen is normally on. In addition, the on/off ratio of the transistor cannot be high enough. Therefore, in this specification, a "high-purity oxide semiconductor" is an intrinsic or substantially intrinsic oxide semiconductor from which hydrogen is reduced as much as possible. As an example of a high-purity oxide semiconductor, there is an oxide semiconductor whose carrier concentration is lower than $1\times10^{14}/cm^3$, preferably lower than $1\times10^{12}/cm^3$, more preferably lower than $1\times10^{11}$ ($cm^3$ or lower than $6.0\times10^{10}/cm^3$. A transistor including a high-purity oxide semiconductor which is obtained by drastic removal of hydrogen contained in an oxide semiconductor layer for a channel formation region has much lower off-state current than a transistor including silicon for a channel formation region, for example. Note that in this embodiment, a transistor including a high-purity oxide semiconductor is described below as an n-channel transistor.

Next, measurement results of the off state current of a transistor including a high-purity oxide semiconductor layer that are obtained using a test element group (also referred to as TEG) are described below.

Figure 16:
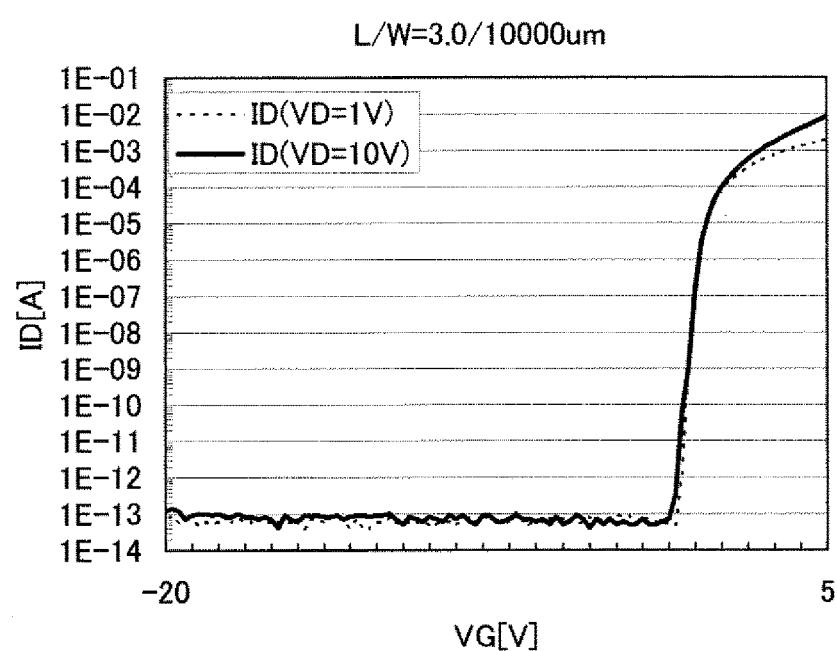
FIG. 16 illustrates electrical characteristics of a transistor.

In the TEG, a thin film transistor with L/W (the ratio of the channel length L to the channel width W)=3 μm/10000 μm in which two hundred transistors with L/W=3 μm/50 μm (thickness d: 30 nm) each are connected in parallel is provided. FIG. 16 illustrates the initial characteristics of the transistor. In order to measure the initial characteristics of the transistor, a change in characteristics of source-drain current (hereinafter referred to as drain current or $I_D$) when source-gate voltage (hereinafter referred to as gate voltage or $V_G$) is changed, i.e., $V_G$-$I_D$ characteristics were measured under the condition that the substrate temperature was at room temperature, source-drain voltage (hereinafter referred to as drain voltage or $V_D$) was 1 V or 10 V, and $V_G$ was changed from −20 to +20 V. Here, the measurement results of the $V_G$-$I_D$ characteristics are shown by the range of from −20 to +5 V.

As illustrated in FIG. 16, the transistor having a channel width W of 10000 μm has an off-state current of $1\times10^{-13}$ A or less at $V_D$ of 1 V and 10 V, which is less than or equal to the resolution (100 fA) of a measurement device (a semiconductor parameter analyzer, Agilent 4156C manufactured by Agilent Technologies Inc.). The off-state current per micrometer of the channel width corresponds to 10 aA/μm.

In this specification, off-state current (also referred to as leakage current) is current flowing between a source and a drain of an n-channel transistor when given gate voltage which is in the range of from −20 to −5 V is applied at room temperature in the case where the level of the threshold voltage $V_{th}$ of the n-channel transistor is positive. Note that the room temperature is 15 to 25° C. A transistor including an oxide semiconductor that is disclosed in this specification has a current per channel width (W) of 100 aA/μm or less, preferably 10 aA/μm or less, more preferably 10 zA/μm or less at room temperature.

Note that if the amount of the off-state current and the level of the drain voltage are known, resistance when the transistor is off (off resistance R) can be calculated using Ohm's law. If a cross section A of the channel formation region and the channel length L are known, off-state resistivity ρ can be calculated from the formula ρ=RA/L (R indicates off resistance). The off-state resistivity is preferably $1\times10^9$ Ω·m or higher (or $1\times10^{10}$ Ω·m or higher). Here, the cross section A can be calculated from the formula A=dW (d is the thickness of the channel formation region and W is the channel width).

In addition, the temperature characteristics of the transistor including a high-purity oxide semiconductor are favorable. Typically, in the case where the current-voltage characteristics of the transistor when the temperature is changed in the range of from −25 to 150° C. are measured, on-state current, off-state current, field-effect mobility, a subthreshold value (an S value), and threshold voltage hardly change and deteriorate due to temperature.

Further, the energy gap of the oxide semiconductor layer is 2 eV or more, preferably 2.5 eV or more, more preferably 3 eV or more.

Next, hot-carrier degradation of a transistor including an oxide semiconductor is described.

The hot-carrier degradation is degradation of transistor characteristics, e.g., the fluctuation in threshold voltage or generation of gate leakage due to a phenomenon that electrons which are accelerated to high speed become fixed charges by being injected into a gate insulating film from a channel in the vicinity of a drain, or a phenomenon that electrons which are accelerated to high speed form a trap level at an interface of a gate insulating film. The factors of the hot-carrier degradation are channel-hot-electron injection (CHE injection) and drain-avalanche-hot-carrier injection (DAHC injection).

Since the band gap of silicon is as small as 1.12 eV, electrons are easily generated like an avalanche due to an avalanche breakdown, and the number of electrons which are accelerated to high speed so as to go over a barrier to the gate insulating film is increased. In contrast, the oxide semiconductor described in this embodiment has a large band gap of 3.15 eV; thus, the avalanche breakdown does not easily occur and resistance to hot-carrier degradation is higher than that of silicon.

Next, a method for manufacturing the photo sensor having the photodiode 204, the transistor 205, and the transistor 206 over the substrate 1001 is described.

First, the semiconductor layer 1005 and the semiconductor layer 1006 are formed over the substrate 1001. A crystalline semiconductor is preferably used as the materials of the semiconductor layer 1005 and the semiconductor layer 1006. In particular, polysilicon or single crystal silicon is preferably used.

Here, an example of a method for forming the semiconductor layer 1005 and the semiconductor layer 1006 over the substrate 1001 with the use of single crystal silicon is described. First, a damaged region is formed by ion irradiation or the like at a predetermined depth of a single crystal silicon substrate. Then, the single crystal silicon substrate and the substrate 1001 are attached to each other with an insulating film provided therebetween. After that, the single crystal silicon substrate is separated from the damaged region, and a semiconductor film is formed over the substrate 1001. The semiconductor film is processed (patterned) into a desired shape by etching or the like so that the semiconductor layer 1005 and the semiconductor layer 1006 are formed. Here, the semiconductor layers are preferably heated before or/and after the etching process so that crystal defects contained in the separated semiconductor layers are reduced and surfaces of the semiconductor layers are flattened. Laser light, RTA (rapid thermal annealing), or an electric furnace may be used as a heating means. As described above, the semiconductor layer 1005 and the semiconductor layer 1006 can be formed in the same process; thus, the number of manufacture processes can be reduced. Therefore, the semiconductor layer 1005 and the semiconductor layer 1006 are formed using the same material over the same surface.

Note that it is preferable to provide an insulating film which serves as a base film between the substrate 1001, and the semiconductor layer 1005 and the semiconductor layer 1006. The base film has a function of preventing diffusion of an impurity element from the substrate 1001, and may be formed to have a single-layer structure or a layered structure including one or more films selected from a silicon nitride film, a silicon oxide film, a silicon nitride oxide film, or a silicon oxynitride film.

Then, an insulating film 1007 is formed over the semiconductor layer 1005 and the semiconductor layer 1006. The insulating film 1007 functions as a gate insulating film of the transistor 205. The insulating film 1007 may be formed to have a single-layer structure or a layered structure including one or more films selected from a silicon nitride film, a silicon oxide film, a silicon nitride oxide film, or a silicon oxynitride film. In addition, the insulating film 1007 may be formed by plasma-enhanced CVD, sputtering, or the like.

Then, contact holes are formed in the insulating film 1007, and then the wirings 208 and 213 are formed. The wiring 208 is electrically connected to the p-type layer 1021 (the anode side of the photodiode 204) through the contact hole. The wiring 213 is electrically connected to the n-type layer 1023 (the cathode side of the photodiode 204) through the contact hole. In addition, the wiring 213 functions as a gate electrode of the transistor 205.

The wirings 208 and 213 can be formed to have a single-layer structure or a layered structure including a metal material such as molybdenum, titanium, chromium, tantalum, tungsten, aluminum, copper, neodymium, or scandium, or an alloy material which contains the metal material as a main component. Specific examples of a two-layer structure of the wirings 208 and 213 include a structure in which a molybdenum layer is stacked over an aluminum layer, a structure in which a molybdenum layer is stacked over a copper layer, a structure in which a titanium nitride layer or a tantalum nitride layer is stacked over a copper layer, and a structure in which a molybdenum layer is stacked over a titanium nitride layer. As a specific example of a three-layer structure, there is a structure in which a tungsten layer (or a tungsten nitride layer), an alloy layer of aluminum and silicon (or an alloy layer of aluminum and titanium), and a titanium nitride layer (or a titanium layer) are stacked. Note that the gate electrode can be formed using a light-transmitting conductive film. As a specific example of a light-transmitting conductive film, there is a light-transmitting conductive oxide.

Then, the insulating film 1009 is formed so as to cover the insulating film 1007 and the wirings 208 and 213. The insulating film 1009 may have a single-layer structure or a layered structure. For example, the insulating film 1009 may have a structure in which an organic resin film is stacked over an inorganic insulating film. The inorganic insulating film has a function of preventing an impurity from entering the photodiode 204 or the transistor 205. The organic resin film has a function of flattening a surface. As the material of the inorganic insulating film, a silicon oxide layer, a silicon nitride layer, a silicon oxynitride layer, a silicon nitride oxide layer, or an aluminum oxide layer can be used. As the material of the organic resin film, a heat-resistant organic material, such as polyimide, acrylic, benzocyclobutene, polyamide, or epoxy, can be used. Other than the organic material, a siloxane-based resin can be used. Here, a siloxane-based resin corresponds to a resin including a Si—O—Si bond which is formed from a siloxane-based material as a starting material. The siloxane-based resin may include an organic group (e.g., an alkyl group or an aryl group) as a substituent. Further, the organic group may include a fluoro group.

There is no particular limitation on a method for forming the inorganic insulating film. The inorganic insulating film can be formed by plasma-enhanced CVD, sputtering or the like. Further, there is no particular limitation on a method for forming the organic resin film. The organic resin film can be formed, depending on the material, by a method such as sputtering, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater.

Then, the gate electrode 1010 is formed over the insulating film 1009. It is preferable that end portions of the gate electrode be tapered because coverage with a gate insulating film stacked thereover is improved. Note that a material which can be used for the wirings 208 and 213 can be used as the material of the gate electrode 1010 as appropriate.

Then, the insulating film 1011 is formed over the gate electrode 1010. The insulating film 1011 can be formed to have a single-layer structure or a layered structure including a silicon oxide film, a silicon nitride film, a silicon oxynitride film, a silicon nitride oxide film, or an aluminum oxide film by plasma-enhanced CVD, sputtering, or the like. Note that in order that a large amount of hydrogen be not contained in the insulating film 1011, the insulating film 1011 is preferably deposited by sputtering. In the case where a silicon oxide film is deposited by sputtering, a silicon target or a quartz target is used as a target and oxygen or a mixed gas of oxygen and argon is used as a sputtering gas.

Alternatively, the insulating film 1011 can have a structure in which a silicon nitride film and a silicon oxide film are sequentially stacked from the gate electrode 1010 side. For example, a 100-nm-thick gate insulating film may be formed in such a manner that a silicon nitride film ($SiN_y$ (y>0)) with a thickness of 50 to 200 nm is formed as a first gate insulating film by sputtering and a silicon oxide film ($SiO_x$ (x>0)) with a thickness of 5 to 300 nm is stacked as a second gate insulating film over the first gate insulating film.

Next, a semiconductor layer is formed over the insulating film 1011. In this embodiment, an oxide semiconductor layer is formed as the semiconductor layer by sputtering.

Here, in order that hydrogen, a hydroxyl group, and moisture be contained in the oxide semiconductor layer as little as possible, it is preferable that an impurity such as hydrogen or moisture that is adsorbed on the insulating film 1011 be eliminated and exhausted by preheating of the substrate 1001 in a preheating chamber of a sputtering apparatus as pretreatment for deposition. Note that as an exhaustion means provided in the preheating chamber, a cryopump is preferable.

As the deposition target of the oxide semiconductor layer, a metal oxide containing zinc oxide as a main component can be used. For example, a target with a composition ratio of $In_2O_3:Ga_2O_3:ZnO=1:1:1$ [molar ratio] can be used. Alternatively, a target with a composition ratio of $In_2O_3:Ga_2O_3:ZnO=1:1:2$ [molar ratio] or $In_2O_3:Ga_2O_3:ZnO=1:1:4$ [molar ratio] can be used. Alternatively, a target containing $SiO_2$ at 2 to 10 wt % can be used. The filling rate of an oxide semiconductor target is 90 to 100%, preferably 95 to 99.9%. With the use of the oxide semiconductor target with a high filling rate, the oxide semiconductor layer can have high density.

Note that the oxide semiconductor layer may be deposited in a rare gas (typically argon) atmosphere, an oxygen atmosphere, or a mixed atmosphere of a rare gas and oxygen. Here, as a sputtering gas used for deposition of the oxide semiconductor layer, a high-purity gas from which an impurity such as hydrogen, water, a hydroxyl group, or hydride is removed to about a concentration of ppm or ppb is preferably used.

The oxide semiconductor layer is deposited over the insulating film 1011 in such a manner that the substrate is held in a treatment chamber kept in a reduced pressure state, moisture remaining in the treatment chamber is removed, a sputtering gas from which hydrogen and moisture are removed is introduced, and a metal oxide is used as a target. In order to remove moisture remaining in the treatment chamber, an adsorption vacuum pump is preferably used. For example, a cryopump, an ion pump, or a titanium sublimation pump is preferably used. As an exhaust means, a turbo pump to which a cold trap is added may be used. For example, a hydrogen atom, a compound containing a hydrogen atom, such as water ($H_2O$), (preferably, also a compound containing a carbon atom), and the like are exhausted from the treatment chamber with the use of a cryopump. Therefore, the concentration of an impurity contained in the oxide semiconductor layer which is deposited in the treatment chamber can be lowered. Further, the substrate may be kept at room temperature or may be heated at a temperature lower than 400° C. when the oxide semiconductor layer is deposited.

As an example of the deposition condition of the oxide semiconductor layer, the following condition is employed: the substrate temperature is at room temperature, the distance between the substrate and the target is 110 mm, the pressure is 0.4 Pa, the direct current (DC) power is 0.5 kW, and an atmosphere containing oxygen and argon (the flow rate of oxygen is 15 sccm and the flow rate of argon is 30 sccm) is used. Note that it is preferable that pulsed direct-current (DC) power be used because dust can be reduced and the film thickness can be uniform. The thickness of the oxide semiconductor layer is 2 to 200 nm, preferably 5 to 30 nm. Note that the appropriate thickness of the oxide semiconductor film differs depending on an oxide semiconductor material, and the thickness may be set as appropriate depending on the material.

Although an In—Ga—Zn—O-based oxide that is an oxide of three metal elements is used as the oxide semiconductor in the given example, the following oxides can be used: an In—Sn—Ga—Zn—O-based oxide that is an oxide of four metal elements; an In—Sn—Zn—O-based oxide, an In—Al—Zn—O-based oxide, a Sn—Ga—Zn—O-based oxide, an Al—Ga—Zn—O-based oxide, or a Sn—Al—Zn—O-based oxide that is an oxide of three metal elements; an In—Zn—O-based oxide, a Sn—Zn—O-based oxide, an Al—Zn—O-based oxide, a Zn—Mg—O-based oxide, a Sn—Mg—O-based oxide, or an In—Mg—O-based oxide that is an oxide of two metal elements; an In—O-based oxide; a Sn—O-based oxide; a Zn—O-based oxide; and the like. The oxide semiconductor may further contain silicon. Further, the oxide semiconductor may be amorphous or crystalline. Further, the oxide semiconductor may be non-single-crystal or single crystal.

As the oxide semiconductor layer, a thin film expressed by $InMO_3(ZnO)_m$ (>0) can be used. Here, M denotes one or more metal elements selected from Ga, Al, Mn, or Co. For example, M can be Ga, Ga and Al, Ga and Mn, or Ga and Co.

Then, the oxide semiconductor layer is processed into the semiconductor layer 1012 in a photolithography process. Note that a resist used for forming the semiconductor layer 1012 may be formed by an inkjet method. When the resist is formed by an inkjet method, a photomask is not used; thus, manufacturing cost can be reduced.

Note that as the etching of the oxide semiconductor layer, dry etching, wet etching, or both dry etching and wet etching may be employed.

In the case of dry etching, parallel plate RIE (reactive ion etching) or ICP (inductively coupled plasma) etching can be used. In order to etch the layer to have a desired shape, the etching conditions (the amount of electric power applied to a coiled electrode, the amount of electric power applied to an electrode on a substrate side, the temperature of the electrode on the substrate side, and the like) are adjusted as appropriate.

As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride (Car)) is preferable; however, a gas containing fluorine (a fluorine-based gas such as carbon tetrafluoride (CEO, sulfur hexafluoride ($SF_6$), nitrogen trifluoride ($NF_3$), or trifluorornethane ($CHF_3$)), hydrogen bromide (HBO, oxygen ($O_2$), any of these gases to which a rare gas such as helium (He) or argon (Ar) is added, or the like can be used.

As an etchant used for wet etching, a mixed solution of phosphoric acid, acetic acid, and nitric acid, an ammonia hydrogen peroxide mixture (a hydrogen peroxide solution at 31 wt %:ammonia water at 28 wt %:water=5:2:2), or the like can be used. Alternatively, ITO-07N (manufactured by KANTO CHEMICAL CO., INC.) may be used. The etching conditions (e.g., an etchant, etching time, and temperature) may be adjusted as appropriate depending on the material of the oxide semiconductor.

In the case of wet etching, the etchant is removed together with the etched material by cleaning. Waste liquid of the etchant including the removed material may be purified and the material contained in the waste liquid may be reused. When a material (e.g., a rare metal such as indium) contained in the oxide semiconductor layer is collected from the waste liquid after the etching and reused, the resources can be efficiently used.

In this embodiment, the semiconductor layer 1012 is formed by wet etching with the use of a mixed solution of phosphoric acid, acetic acid, and nitric acid as an etchant.

Then, the semiconductor layer 1012 is subjected to first heat treatment so that the oxide semiconductor layer is dehydrated or dehydrogenated. The temperature of the first heat treatment is 400 to 750° C., preferably higher than or equal to 400° C. and lower than the strain point of the substrate. Here, after the substrate is put in an electric furnace which is a kind of heat treatment apparatus, the oxide semiconductor layer is subjected to heat treatment at 450° C. for 1 h in a nitrogen atmosphere. Thus, mixture of water or hydrogen into the oxide semiconductor layer is prevented and the oxide semiconductor layer is obtained. Through the first heat treatment, hydrogen, water, a hydroxyl group, or the like can be removed from the semiconductor layer 1012.

Note that the heat treatment apparatus is not limited to an electric furnace, and may be provided with a device for heating an object to be processed by thermal conduction or thermal radiation from a heater such as a resistance heater. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. An inert gas (typically a rare gas such as argon) or a nitrogen gas can be used as the gas.

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature. GRTA enables high-temperature heat treatment in a short time.

In the first heat treatment, it is preferable that water, hydrogen, or the like be not contained in the atmosphere. Alternatively, the purity of a gas such as nitrogen, helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Note that depending on the condition of the first heat treatment or the material of the oxide semiconductor layer, the semiconductor layer 1012 might be crystallized by the first heat treatment and the crystal structure thereof might be changed into a microcrystalline structure or a polycrystalline structure. For example, the oxide, semiconductor layer might be a microcrystalline oxide semiconductor layer having a degree of crystallinity of 80% or more. Note that even when the first heat treatment is performed, the semiconductor layer 1012 might be an amorphous oxide semiconductor layer without crystallization. The semiconductor layer 1012 might be an oxide semiconductor layer in which a microcrystalline portion (with a grain diameter of 1 to 20 nm, typically 2 to 4 nm) is mixed into an amorphous oxide semiconductor layer.

In addition, the first treatment performed on the semiconductor layer 1012, may be performed on the oxide semiconductor layer before being processed into an island-shaped oxide semiconductor layer. In that case, after the first heat treatment, the substrate is taken out of the heat treatment apparatus and a first photolithography process is performed. Alternatively, the first heat treatment may be performed after the wiring 211 and a wiring 1014 are formed over the oxide semiconductor layer or after an insulating film 1031 is formed over the wiring 211 and the wiring 1014.

Although the first heat treatment is performed mainly for the purpose of removing an impurity such as hydrogen, water, or a hydroxyl group from the oxide semiconductor layer, oxygen defects might be generated in the oxide semiconductor layer in the first heat treatment. Therefore, excessive oxidation treatment is preferably performed after the first heat treatment. Specifically, heat treatment in an oxygen atmosphere or an atmosphere containing nitrogen and oxygen (for example, nitrogen to oxygen is 4 to 1 in volume ratio) is performed as the excessive oxidation treatment performed after the first heat treatment, for example. Alternatively, plasma treatment in an oxygen atmosphere can be employed.

Then, a conductive film is formed after contact holes are formed in the insulating film 1007, the insulating film 1009, and the insulating film 1011.

Note that it is preferable that reverse sputtering be performed before the formation of the conductive film so that a resist residue or the like that attaches onto surfaces of the semiconductor layer 1012 and the insulating film 1011 is removed.

The conductive film may be formed by sputtering, vacuum evaporation, or the like. As the material of the conductive film, an element selected from aluminum, chromium, copper, tantalum, titanium, molybdenum, or tungsten; an alloy containing the element; an alloy containing a plurality of the elements in combination; or the like can be used. Alternatively, one or more materials selected from manganese, magnesium, zirconium, beryllium, and yttrium may be used. Alternatively, a light-transmitting conductive film may be used. As a specific example of a light-transmitting conductive film, there is a light-transmitting conductive oxide.

Further, the conductive film may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given.

Then, the conductive film is selectively etched so that the wiring 211, the wiring 1014, and the wiring 212 are formed. Note that it is necessary to adjust each material and etching conditions as appropriate so that the semiconductor layer 1012 is not removed at the time of etching of the conductive film and the insulating film 1011 formed below the semiconductor layer 1012 is not exposed. Therefore, in this embodiment, an In—Ga—Zn—O-based oxide semiconductor is used for the semiconductor layer 1012, a titanium film is used as the conductive film, and an ammonia hydrogen peroxide mixture (ammonia water at 28 wt %:water:a hydrogen peroxide solution at 31 wt %) is used as an etchant of the conductive film so that part of the semiconductor layer 1012 is not etched. However, the present invention is not limited to this structure. In other words, part of the semiconductor layer 1012 is etched so that an oxide semiconductor layer having a groove (a depression) can be formed. Note that such a transistor including a semiconductor layer having a groove (a depression) is referred to as a channel-etched transistor.

After the wiring 211, the wiring 1014, and the wiring 212 are formed by the etching, plasma treatment using a gas such as $N_2O$, $N_2$, or Ar is preferably performed so that water or the like adsorbed on an exposed surface of the semiconductor layer 1012 is removed. Further, plasma treatment may be performed using a mixed gas of oxygen and argon. In this embodiment, either plasma treatment is performed.

Then, the insulating film 1031 which is in contact with the exposed region of the semiconductor layer 1012, the wiring 211, the wiring 1014, and the wiring 212 is formed without being exposed to the air after the plasma treatment. At this time, it is preferable that the insulating film 1031 be formed while moisture remaining in the treatment chamber is removed so that hydrogen, a hydroxyl group, or moisture is not contained in the semiconductor layer 1012 and the insulating film 1031. In order to remove moisture remaining in the treatment chamber, an adsorption vacuum pump is preferably used. For example, a cryopump, an ion pump, or a titanium sublimation pump is preferably used. As an exhaust means, a turbo pump to which a cold trap is added may be used. For example, a hydrogen atom, a compound containing a hydrogen atom, such as water ($H_2O$), and the like are exhausted from the treatment chamber with the use of a cryopump. Therefore, the concentration of an impurity contained in the insulating film 1031 which is deposited in the treatment chamber can be lowered.

In this embodiment, an oxide insulating film is formed as the insulating film 1031. For example, a silicon oxide film is formed as the insulating film 1031 in such a manner that the substrate 1001 over which the semiconductor layer 1012, the wiring 211, the wiring 1014, and the wiring 212 are formed is kept at room temperature or heated at a temperature lower than 100° C., a sputtering gas including high-purity oxygen from which hydrogen and moisture are removed is introduced, and a silicon target is used. Note that instead of the silicon oxide film, a silicon oxynitride film, an aluminum oxide film, an aluminum oxynitride film, or the like can be used as the oxide insulating film.

For example, the silicon oxide film is deposited by pulsed DC sputtering under the following condition: a boron-doped silicon target which has a purity of 6N (having a resistivity of 0.01 Ω·cm) is used; the distance between the substrate and the target (the T–S distance) is 89 mm; the pressure is 0.4 Pa; the direct current (DC) power is 6 kW; and the atmosphere is an oxygen atmosphere (an oxygen flow rate ratio is 100%). The thickness of the silicon oxide film is 300 nm. Note that instead of the silicon target, quartz (preferably synthetic quartz) can be used. Oxygen or a mixed gas of oxygen and argon may be used as a sputtering gas.

In addition, it is preferable to perform second heat treatment at 100 to 400° C. in a state where the insulating film 1031 and the semiconductor layer 1012 are in contact with each other. By the heat treatment, an impurity such as hydrogen, moisture, a hydroxyl group, or hydride contained in the semiconductor layer 1012 is diffused into the insulating film 1013, so that the impurity contained in the semiconductor layer 1012 can be reduced.

Through the above steps, the transistor 206 including the semiconductor layer 1012 which is an oxide semiconductor layer whose concentration of hydrogen, moisture, a hydroxyl group, or hydride is lowered can be for rued. As described in this embodiment, when moisture remaining in the reaction atmosphere is removed at the time of the deposition of the oxide semiconductor layer, the concentration of hydrogen and hydride in the oxide semiconductor layer can be lowered. Accordingly, an intrinsic or substantially intrinsic semiconductor can be obtained.

Embodiment 5

In this embodiment, examples of electronic devices including a semiconductor device having a photo sensor are described. Specific examples of electronic devices include display devices, laptops, image reproducing devices provided with recording media (specifically devices which can reproduce image data stored in auxiliary memory devices such as memory cards or memory sticks), cellular phones, portable game machines, personal digital assistants, e-book readers, cameras such as video cameras and digital still cameras, navigation systems, audio reproducing devices (e.g., car audio equipment or audio component sets), copiers, facsimiles, printers, multifunction printers, automated teller machines (ATM), vending machines, and the like.

A semiconductor device of one embodiment of the present invention has high detection accuracy of a photo sensor; thus, a highly reliable electronic device can be provided when such a semiconductor device is mounted on an electronic device.

This application is based on Japanese Patent Application serial no. 2010-007249 filed with Japan Patent Office on Jan. 15, 2010, the entire contents of which are hereby incorporated by reference.

REFERENCE NUMERALS

100: touch panel, 101: pixel portion, 102: display element control circuit, 103: photo sensor control circuit, 104: pixel, 105: display element, 106: photo sensor, 107: display element driver circuit, 108: display element driver circuit, 109: photo sensor readout circuit, 110: photo sensor driver circuit, 120: photo sensor portion, 201: transistor, 202: storage capacitor, 203: liquid crystal element, 204: photodiode, 205: transistor, 206: transistor, 207: gate signal line, 208: photodiode reset signal line, 209: gate signal line, 210: video data signal line, 211: photo sensor output signal line, 212: photo sensor reference signal line, 213: wiring, 231: transistor, 232: wiring, 233: capacitor, 234: wiring, 241: transistor, 242: wiring, 243: wiring, 244: wiring, 301: ADC, 302: ADC, 303: ADC, 304: ADC, 305: ADC, 306: ADC, 307: ADC, 308: ADC, 309: ADC, 310: ADC control circuit, 311: photo sensor signal line, 312: photo sensor signal line, 313: photo sensor signal line, 314: photo sensor signal line, 315: photo sensor signal line, 316: photo sensor signal line, 317: photo sensor signal line, 318: photo sensor signal line, 319: photo sensor signal line, 320: output signal line, 321: ADC output signal line, 322: ADC output signal line, 323: ADC output signal line, 324: ADC output signal line, 325: ADC output signal line, 326: ADC output signal line, 327: ADC output signal line, 328: ADC output signal line, 329: ADC output signal line, 331: ADC control signal line, 332: ADC control signal line, 333: ADC control signal line, 334: ADC control signal line, 335: ADC control signal line, 336: ADC control signal line, 337: ADC control signal line, 338: ADC control signal line, 339: ADC control signal line, 341: auxiliary readout circuit, 342: auxiliary readout circuit, 343: auxiliary readout circuit, 344: auxiliary readout circuit, 345: auxiliary readout circuit, 346: auxiliary readout circuit, 347: auxiliary readout circuit, 348: auxiliary readout circuit, 349: auxiliary readout circuit, 351: circuit control signal line, 352: circuit control signal line, 353: circuit control signal line, 354: circuit control signal line, 355: circuit control signal line, 356: circuit control signal line, 357: circuit control signal line, 358: circuit control signal line, 359: circuit control signal line, 401: oscillation circuit VCO, 402: counter circuit, 403: output signal line, 404: stop signal line, 405: reset signal line, 406: set signal line, 407: count-value increase and decrease control signal line, 500: NOR circuit, 501: transistor, 502: transistor, 503: transistor, 504: transistor, 505: transistor, 506: transistor, 507: transistor, 508: transistor, 509: transistor, 510: transistor, 511: transistor, 512: transistor, 513: transistor, 514: transistor, 515: transistor, 516: transistor, 517: transistor, 518: transistor, 519: reset flip-flop, 520: reset flip-flop, 521: reset flip-flop, 522: reset flip-flop, 523: flip-flop, 524: flip-flop, 525: flip-flop, 526: flip-flop, 527: signal line, 528: signal line, 529: signal line, 530: signal line, 531: signal line, 532: signal line, 533: signal line, 534: signal line, 535: signal line, 536: signal line, 537: signal line, 538: signal line, 539: addition/subtraction circuit, 601: transistor, 602: storage capacitor, 701: potential, 702: potential, 703: potential, 704: potential, 705: potential, 706: potential, 707: potential, 708: potential, 709: potential, 710: potential, 711: potential, 712: potential, 713: potential, 714: potential, 715: potential, 716: potential, 717: potential, 718: potential, 801: potential, 802: potential, 803: potential, 804: potential, 805: potential, 806: potential, 807: potential, 808: potential, 809: potential, 810: potential, 811: potential, 812: potential, 813: potential, 814: potential, 815: potential, 816: potential, 817: potential, 818: potential, 831: potential, 1001: substrate, 1005: semiconductor layer, 1006: semiconductor layer, 1007: insulating film, 1009: insulating film, 1010: gate electrode, 1011: insulating film, 1012: semiconductor layer, 1014: wiring, 1021: p-type layer, 1022: i-type layer, 1023: n-type layer, 1031: insulating film, 1201: object to be detected, and 1202: irradiated light.

The invention claimed is:
1. A semiconductor device comprising:
an analog/digital converter including an oscillation circuit and a counter circuit, wherein the counter circuit is configured to perform addition or subtraction of a count value in the counter circuit;
a photo sensor electrically connected to the oscillation circuit, to input a first signal to the oscillation circuit; and
a signal line electrically connected to the counter circuit, the signal line being arranged so as to select one of a state in which the counter circuit performs the addition of the count value and a state in which the counter circuit performs the subtraction of the count value,
wherein the oscillation circuit is configured to output a second signal obtained by converting the first signal to the counter circuit, the second signal having an oscillation frequency in accordance with the first signal,
wherein the counter circuit is configured to perform the addition of the count value by using the second signal as a clock signal or perform the subtraction of the count value by using the second signal as a clock signal,
wherein the photo sensor includes a photodiode and a transistor,
wherein the photodiode is a pin photodiode,
wherein the transistor includes a region overlapping with a p-type layer of the photodiode or an n-type layer of the photodiode through an insulating film, and
wherein an i-type layer of the photodiode includes a region not overlapping with the transistor.

2. The semiconductor device according to claim 1, wherein the pin photodiode includes silicon.

3. The semiconductor device according to claim 1, wherein the counter circuit is configured to correct an output value by performing the addition of the count value when the photo sensor is in a second state and by performing the subtraction of the count value when the photo sensor is in a first state.

4. The semiconductor device according to claim 1, wherein the first signal is an analog signal, and
wherein the second signal is a digital signal.

5. The semiconductor device according to claim 1, further comprising:
a readout circuit, the readout circuit including:
a transistor; and
a capacitor electrically connected to the transistor,
wherein a wiring is electrically connected to the transistor and the capacitor.

6. The semiconductor device according to claim 1, wherein every time the second signal of the oscillation circuit is changed between a first potential higher than a certain potential and a second potential lower than the certain potential, the count value is decreased by one.

7. A semiconductor device comprising:
an analog/digital converter including an oscillation circuit and a counter circuit, wherein the counter circuit is configured to perform addition or subtraction of a count value in the counter circuit;
a photo sensor including a photodiode, a first transistor, and a second transistor; and
a signal line electrically connected to the counter circuit, the signal line being arranged so as to select one of a state in which the counter circuit performs the addition of the count value and a state in which the counter circuit performs the subtraction of the count value,
wherein a first terminal of the photodiode is electrically connected to a first wiring,
wherein a second terminal of the photodiode is electrically connected to a gate of the first transistor,
wherein one of a source and a drain of the first transistor is electrically connected to a second wiring,
wherein the other of the source and the drain of the first transistor is electrically connected to one of a source and a drain of the second transistor,
wherein the other of the source and the drain of the second transistor is electrically connected to a third wiring configured to output a first signal,
wherein a gate of the second transistor is electrically connected to a fourth wiring,
wherein the oscillation circuit is configured to output a second signal obtained by converting the first signal to the counter circuit, the second signal having an oscillation frequency in accordance with the first signal,
wherein the counter circuit is configured to perform the addition of the count value by using the second signal as a clock signal or perform the subtraction of the count value by using the second signal as a clock signal,
wherein the photodiode is a pin photodiode,
wherein the second transistor includes a region overlapping with a p-type layer of the photodiode or an n-type layer of the photodiode through an insulating film, and
wherein an i-type layer of the photodiode includes a region not overlapping with the second transistor.

8. The semiconductor device according to claim 7, further comprising a third transistor between the second terminal of the photodiode and the gate of the first transistor,
wherein one of a source and a drain of the third transistor is electrically connected to the second terminal of the photodiode,
wherein the other of the source and the drain of the third transistor is electrically connected to the gate of the first transistor, and
wherein a gate of the third transistor is electrically connected to a fifth wiring.

9. The semiconductor device according to claim 8, wherein the first transistor and the second transistor include a channel formation region including crystalline silicon, and
wherein the third transistor includes a channel formation region including oxide semiconductor.

10. The semiconductor device according to claim 9, wherein the channel formation region has a carrier concentration lower than $1\times10^{14}/cm^3$.

11. The semiconductor device according to claim 7, wherein at least one of the first transistor and the second transistor includes a channel formation region including oxide semiconductor.

12. The semiconductor device according to claim 7, wherein the pin photodiode includes silicon.

13. The semiconductor device according to claim 7, wherein the counter circuit is configured to correct an output value by performing the addition of the count value when the photo sensor is in a second state and by performing the subtraction of the count value when the photo sensor is in a first state.

14. The semiconductor device according to claim 7, wherein the first signal is an analog signal, and
wherein the second signal is a digital signal.

15. The semiconductor device according to claim 7, wherein the photodiode includes a first region having n-type conductivity and a second region having a p-type conductivity, and
wherein the gate of the second transistor overlaps with one of the first region and the second region.

16. The semiconductor device according to claim 7, wherein the photodiode includes a first region having n-type conductivity and a second region having a p-type conductivity, and wherein the first region and the second region are over and in contact with a same surface.

17. The semiconductor device according to claim 7, further comprising:
a readout circuit, the readout circuit including:
a third transistor; and
a capacitor electrically connected to the third transistor,
wherein the third wiring is electrically connected to the third transistor and the capacitor.

18. The semiconductor device according to claim 7,
wherein every time the second signal of the oscillation circuit is changed between a first potential higher than a certain potential and a second potential lower than the certain potential, the count value is decreased by one.

19. A semiconductor device comprising:
an analog/digital converter including an oscillation circuit and a counter circuit,
wherein the counter circuit is configured to perform addition or subtraction of a count value in the counter circuit;
a pixel portion including a photo sensor, the photo sensor including a photodiode, a first transistor, and a second transistor; and
a signal line electrically connected to the counter circuit, the signal line being arranged so as to select one of a state in which the counter circuit performs the addition of the count value and a state in which the counter circuit performs the subtraction of the count value,
wherein a first terminal of the photodiode is electrically connected to a first wiring,
wherein a second terminal of the photodiode is electrically connected to a gate of the first transistor,
wherein one of a source and a drain of the first transistor is electrically connected to a second wiring,
wherein the other of the source and the drain of the first transistor is electrically connected to one of a source and a drain of the second transistor,
wherein the other of the source and the drain of the second transistor is electrically connected to a third wiring configured to output a first signal,
wherein a gate of the second transistor is electrically connected to a fourth wiring,
wherein the oscillation circuit is configured to output a second signal obtained by converting the first signal to the counter circuit, the second signal having an oscillation frequency in accordance with the first signal,
wherein the counter circuit is configured to perform the addition of the count value by using the second signal as a clock signal or perform the subtraction of the count value by using the second signal as a clock signal,
wherein the photodiode is a pin photodiode,
wherein the second transistor includes a region overlapping with a p-type layer of the photodiode or an n-type layer of the photodiode through an insulating film, and
wherein an i-type layer of the photodiode includes a region not overlapping with the second transistor.

20. The semiconductor device according to claim 19, further comprising a third transistor between the second terminal of the photodiode and the gate of the first transistor,
wherein one of a source and a drain of the third transistor is electrically connected to the second terminal of the photodiode,
wherein the other of the source and the drain of the third transistor is electrically connected to the gate of the first transistor, and
wherein a gate of the third transistor is electrically connected to a fifth wiring.

21. The semiconductor device according to claim 20,
wherein the first transistor and the second transistor include a channel formation region including crystalline silicon, and
wherein the third transistor includes a channel formation region including oxide semiconductor.

22. The semiconductor device according to claim 21, wherein the channel formation region has a carrier concentration lower than $1\times10^{14}/cm^3$.

23. The semiconductor device according to claim 19, wherein at least one of the first transistor and the second transistor includes a channel formation region including oxide semiconductor.

24. The semiconductor device according to claim 19, wherein the pin photodiode includes silicon.

25. The semiconductor device according to claim 19,
wherein the counter circuit is configured to correct an output value by performing the addition of the count value when the photo sensor is in a second state and by performing the subtraction of the count value when the photo sensor is in a first state.

26. The semiconductor device according to claim 19,
wherein the first signal is an analog signal, and
wherein the second signal is a digital signal.

27. The semiconductor device according to claim 19,
wherein the gate of the second transistor overlaps with one of the n-type layer and the p-type layer.

28. The semiconductor device according to claim 19,
wherein the n-type layer and the p-type layer are over and in contact with a same surface.

29. The semiconductor device according to claim 19, further comprising:
a readout circuit, the readout circuit including:
a third transistor; and
a capacitor electrically connected to the third transistor,
wherein the third wiring is electrically connected to the third transistor and the capacitor.

30. The semiconductor device according to claim 19,
wherein every time the second signal of the oscillation circuit is changed between a first potential higher than a certain potential and a second potential lower than the certain potential, the count value is decreased by one.

31. A semiconductor device comprising:
a photo sensor; and
a readout circuit,
wherein the readout circuit comprises an analog/digital converter,
wherein a signal output from the photo sensor is input to the readout circuit,
wherein the photo sensor comprises a photodiode and a transistor,
wherein the photodiode is a lateral junction pin diode,
wherein the transistor comprises an oxide semiconductor in a channel formation region,
wherein the transistor includes a region overlapping with a p-type layer or an n-type layer of the photodiode, and
wherein the transistor does not overlap with an i-type layer of the photodiode.

* * * * *